US007091056B2

(12) United States Patent
Asatsuma et al.

(10) Patent No.: US 7,091,056 B2
(45) Date of Patent: Aug. 15, 2006

(54) METHOD OF MANUFACTURING A SEMICONDUCTOR LIGHT EMITTING DEVICE, SEMICONDUCTOR LIGHT EMITTING DEVICE, METHOD OF MANUFACTURING A SEMICONDUCTOR DEVICE, SEMICONDUCTOR DEVICE, METHOD OF MANUFACTURING A DEVICE, AND DEVICE

(75) Inventors: Tsunenori Asatsuma, Kanagawa (JP); Shigetaka Tomiya, Tokyo (JP); Koshi Tamamura, Tokyo (JP); Tsuyoshi Tojo, Miyagi (JP); Osamu Goto, Miyagi (JP); Kensaku Motoki, Osaka (JP)

(73) Assignees: Sony Corporation, Tokyo (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/148,771

(22) Filed: Jun. 9, 2005

(65) Prior Publication Data
US 2005/0227392 A1    Oct. 13, 2005

Related U.S. Application Data

(60) Division of application No. 10/719,206, filed on Nov. 21, 2003, which is a continuation of application No. PCT/JP02/10323, filed on Oct. 3, 2002.

(30) Foreign Application Priority Data
Oct. 12, 2001  (JP)  ............................ P2001-315703

(51) Int. Cl.
    *H01L 21/00*    (2006.01)

(52) U.S. Cl. ........................................ 438/22; 438/341

(58) Field of Classification Search ................ 438/481, 438/341, 47, 22; 257/189–190, 49–96
See application file for complete search history.

(56) References Cited

U.S. PATENT DOCUMENTS 6,015,979 A    1/2000  Sugiura et al.

(Continued)

FOREIGN PATENT DOCUMENTS

EP    1 005 068 A2    5/2000

(Continued)

OTHER PUBLICATIONS

M. Suzuki, "Review on Future Ferroelectric Nonvolatile Memory: FeRAM", Journal of the Ceramic Society of Japan, vol. 103, No. 11 (1995), pp. 1099-1111.

(Continued)

*Primary Examiner*—Sara Crane
(74) *Attorney, Agent, or Firm*—Sonnenschein Nath & Rosenthal LLP

(57) ABSTRACT

When a semiconductor light emitting device or a semiconductor device is manufactured by growing nitride III–V compound semiconductor layers, which will form a light emitting device structure or a device structure, on a nitride III–V compound semiconductor substrate composed of a first region in form of a crystal having a first average dislocation density and a plurality of second regions having a second average dislocation density higher than the first average dislocation density and periodically aligned in the first region, device regions are defined on the nitride III–V compound semiconductor substrate such that the device regions do not substantially include second regions, emission regions or active regions of devices finally obtained do not include second regions.

12 Claims, 36 Drawing Sheets

U.S. PATENT DOCUMENTS

| | | | |
|---|---|---|---|
| 6,362,515 B1 * | 3/2002 | Hayakawa | 257/639 |
| 6,606,335 B1 * | 8/2003 | Kuramata et al. | 372/45.01 |
| 6,667,184 B1 | 12/2003 | Motoki et al. | |
| 2001/0016404 A1 * | 8/2001 | Hayakawa | 438/496 |
| 2001/0025989 A1 * | 10/2001 | Shibuya et al. | 257/347 |
| 2001/0029086 A1 * | 10/2001 | Ogawa et al. | 438/448 |
| 2001/0032975 A1 * | 10/2001 | Yamaguchi et al. | 257/13 |
| 2001/0038655 A1 | 11/2001 | Tanaka et al. | |
| 2002/0048964 A1 * | 4/2002 | Yuasa et al. | 438/763 |
| 2002/0064195 A1 * | 5/2002 | Takeya et al. | 372/45 |

FOREIGN PATENT DOCUMENTS

| | | |
|---|---|---|
| EP | 1 088 914 A1 | 4/2001 |
| JP | 11-103135 | 4/1999 |
| JP | 11-195813 | 7/1999 |
| JP | 11-238687 | 8/1999 |
| JP | 2000-21789 | 1/2000 |
| JP | 2000-164929 | 6/2000 |
| JP | 2000-353669 | 12/2000 |
| JP | 2001-257193 | 9/2001 |
| JP | 2002-033512 | 1/2002 |
| JP | 2003-078214 | 3/2003 |

OTHER PUBLICATIONS

M. Suzuki, et al., "*A proposal of epixtaxial axide thin film structure for future oxide electronics*", Materials Science and Engineering B41 (1996), pp. 166-173.

* cited by examiner

LAYOUT WITH REGION B
ON CLEAVED EDGE (FIRST EXAMPLE)

LAYOUT WITHOUT REGION B
ON CLEAVED EDGE (SECOND EXAMPLE)

e.g. 400 μm e.g. 400 μm e.g. 200 μm

⟨11-20⟩ DIRECTION e.g. 400μm e.g. 400 μm e.g. 400 μm e.g. 200 μm

METHOD OF MANUFACTURING A SEMICONDUCTOR LIGHT EMITTING DEVICE, SEMICONDUCTOR LIGHT EMITTING DEVICE, METHOD OF MANUFACTURING A SEMICONDUCTOR DEVICE, SEMICONDUCTOR DEVICE, METHOD OF MANUFACTURING A DEVICE, AND DEVICE

RELATED APPLICATION DATA

This application is a divisional of co-pending application Ser. No. 10/719,206 filed Nov. 21, 2003, which is a continuation of PCT application No. PCT/JP02/10323 filed Oct. 3, 2002. The present and foregoing applications claim priority to Japanese Application No. P2001-315703 filed Oct. 12, 2001. Each of these applications is incorporated herein by reference to the extent permitted by law.

This invention relates to a method of manufacturing a semiconductor light emitting device, a semiconductor light emitting device, method of manufacturing a semiconductor device, a semiconductor device, a method of manufacturing a device, and a device itself, that are suitable for use in the manufacture of semiconductor lasers, light emitting diodes or electron transport devices composed of nitride III–V compound semiconductors, for example.

Widely used conventional methods for manufacturing semiconductor devices first grow desired semiconductor layers on appropriate substrates and then treat the layers. In general, semiconductor layers are liable to change in properties, very sensitively following information on substrates, such as their lattice constants. Therefore, it will be the best way to use substrates that are homogeneous to desired semiconductor layers and to grow thereon the semiconductor layers by epitaxial growth.

Therefore, substrates of semiconductor devices should preferably be made of materials that are common in nature to semiconductors used in devices and have low densities of dislocations or other defects. This is because defects of substrates are copied to semiconductor layers growing thereon and often invite deterioration of device properties.

Nitride III–V compound semiconductors represented by GaN have large band gaps. For this advantage, they are under progressive development in form of light emitting elements for wavelength ranges from ultraviolet to violet, blue and green, which are difficult to obtain with other semiconductors. Actually, light emitting diodes (LEDs) and semiconductor lasers (LDs) using nitride III–V compound semiconductors have been brought into practice.

However, nitride III–V compound semiconductors are difficult to form by bulk growth, and it has been difficult to obtain substrates reduced in defect to a level acceptable for use as substrates of semiconductor devices. Therefore, in almost all cases, nitride III–V compound semiconductors must be formed by crystalline growth on substrates of sapphire, SiC, or the like, that are different in nature from the nitride III–V compound semiconductors to be grown, and the process of forming low-temperature buffer layers is required. However, even through that process, nitride III–V compound semiconductors obtained by growth exhibit very high defect densities, and give considerable influences to device properties.

Under the circumstances, there is a demand for a substrate of the same quality, that is, made of a nitride III–V compound semiconductor, and having a reduced density of defects, which is suitable for use as a substrate for manufacturing a nitride III–V compound semiconductor device having improved properties.

Heretofore, JP-2001-102307 has proposed a method of manufacturing a single-crystal GaN substrate as a method of manufacturing a nitride III–V compound semiconductor substrate having a reduced density of defects. This method intends to reduce dislocations by controlling the growth surface of vapor-phase deposition to have a three-dimensional facet structure instead of a flat state and progressing growth while keeping the facet structure and not burying the facet structure.

However, the technique disclosed by JP-2001-102307 concentrates breakthrough dislocations especially to certain regions of the growth layer and thereby reduces breakthrough dislocations of the other regions. Therefore, the single-crystal GaN substrate locally includes low defect density regions and high defect density regions. Moreover, it is out of control where the high defect density regions appear, and they appear at random. Therefore, in case a semiconductor device, such as a semiconductor laser, is manufactured by growth of nitride III–V compound semiconductor layers on the single-crystal GaN substrate, this technique cannot prevent a high defect density region from being formed in the emission region, and inevitably invites degradation of emission properties and reliability of semiconductor lasers.

It is therefore an object of the invention to provide a semiconductor light emitting device excellent in property such as emission property, reliable and elongated in lifetime, as well as a method capable of manufacturing such a semiconductor light emitting device.

More broadly, an object of the invention is to provide a semiconductor device improved in property, reliable and elongated in lifetime, as well as a method capable of manufacturing such a semiconductor device.

Still more broadly, an object of the invention is to provide various types of devices excellent in property, reliable and elongated in lifetime, as well as a method capable of manufacturing such devices.

SUMMARY OF THE INVENTION

The Inventor conducted vigorous researches toward a solution of the above-mentioned objects. The researches are summarized below.

The Inventor made improvements the technique disclosed by JP-2001-102307 over and over, and could make a success in controlling positions of high defect density regions appearing among low defect density regions. This makes it possible to obtain a substrate in which high defect density regions are appear regularly, for example periodically, among low defect density regions, and makes it possible to change the pattern of layout of high defect density regions as desired.

In case of manufacturing a semiconductor light emitting device such as a semiconductor laser, or more generally, a semiconductor device, by using such a substrate, it is necessary to eliminate or reduce adverse influences to the device from high defect density regions existing in the substrate. The Inventor made various researches about techniques for this purpose, and has found the following technique to be effective.

In the substrate, high defect density regions can be controlled to appear regularly, it is possible to determine the size of devices, placement of devices or locations of active regions of the devices (for example, emission regions in case of light emitting devices) in accordance with the layout of the high defect density regions in the stage of their design. The design can be determined such that high defect density regions do not reside in regions that will be finally extracted as chips by dicing the substrate (called "device regions" hereunder) or in active regions of devices. Thereby, even if any defects propagate from high defect density regions of the base substrate to semiconductor layers grown on the substrate, adverse influences to the device regions or active regions can be prevented. Therefore, deterioration of devices and degradation of their reliability caused by those defects can be prevented.

The above-mentioned technique is effective also for manufacturing a semiconductor device using semiconductors other than nitride III–V compound semiconductors when it is difficult to obtain a substrate of the same nature as that of semiconductors used as a device and exhibiting a low defect density. More generally, in case a substrate of the same nature as that of the material used as a device and having a low defect density is difficult to obtain, the above-mentioned technique is effective for manufacturing the device.

The present invention has been made after further studies by the Inventor based on the above-explained knowledge.

To accomplish the above objects, the fist aspect of the invention is a method of manufacturing a semiconductor light emitting device by growing nitride III–V compound semiconductor layers forming a light emitting device structure on a nitride III–V compound semiconductor substrate in which a plurality of second regions having a second average dislocation density higher than a first average dislocation density align regularly in a first region made of a crystal and having the first average dislocation density, comprising:

defining a device region on the nitride III–V compound semiconductor substrate such that the device region does not include the second regions substantially.

The definition saying "do not include second regions substantially" not only means that each device region may include second regions along the entire border lines thereof, but also means that the border lines of each device region may pass through second regions, and the second regions may remain on end surfaces or at corners of chips obtained by dicing the substrate (also in the description hereunder).

Specifically, device regions are determined in size and layout not to include second regions substantially. A plurality of second regions are typically formed periodically, for example, in form of hexagonal lattices, rectangular lattices, or square lattices. Two or more of these layout patterns may be mixed. It is also acceptable that the substrate includes a region where the second regions periodically appear and a region where the second regions appear regularly but not periodically.

Each device region is typically rectangular or square. For better cleavage or other purposes, a pair of opposite sides of each device region are preferably parallel to the <1-100> direction, and the other pair of opposite sides is parallel to the <11-20> direction.

Interval between two adjacent second regions or period of arrangement of the second regions is determined depending upon the size of devices. Typically, however, it is 20 μm or more, 50 μm or more, or 100 μm or more. There is no definite maximum value of the interval or period of the second regions. Typically, however, it is around 1000 μm in maximum. The second regions typically pass through the nitride III–V compound semiconductor substrate. Each of the second regions typically has an arbitrary polygonal prismatic shape. Third regions having a third average dislocation density higher than the first average dislocation density and lower than the second average dislocation density are often interposed between the first region and the second regions. In this case, each device region is most preferably defined not to contain the second and third regions substantially.

Diameter of each second region is typically from 10 μm to 100 μm, or more typically from 20 μm to 50 μm. In case the substrate include the third regions, diameter of each third region is typically larger than the diameter of the second region by from 20 μm to 200 μm, more typically by from 40 μm to 160 μm, or most typically by from 60 μm to 140 μm.

Average dislocation density of the second regions, in general, is five times or more of the average dislocation density of the first region. Typically, average dislocation density of the first region is $2 \times 10^6$ cm$^{-2}$ or less, and average dislocation density of the second regions is $1 \times 10^8$ cm$^{-2}$ or more. In case the substrate includes the third regions, its average dislocation density is typically smaller than $1 \times 10^8$ cm$^{-2}$ and larger than $2 \times 10^6$ cm$^{-2}$.

In order to prevent adverse influences from the second regions having a high average dislocation density, emission regions of semiconductor light emitting devices are distant from the second regions by 1 μm or more, preferably by 10 μm or more, or more preferably by 100 μm or more. In case the substrate includes the third regions, it is most preferable for the emission regions of the semiconductor light emitting devices to be off both the second and third regions. More specifically, the semiconductor light emitting devices are semiconductor lasers or light emitting diodes. In case they are semiconductor lasers, regions supplied with a drive current through a stripe-shaped electrode should be distant from the second regions preferably by 1 μm or more, more preferably by 10 μm or more, and still more preferably by 100 μm or more. In case the substrate includes the third regions, the regions supplied with a drive current through stripe-shaped electrodes should most preferably be off both the second regions and the third regions. The stripe-shaped electrode may be either singular or plural, and its width may be determined as desired.

The border lines of each device region are determined to use the given area of the substrate efficiently, depending upon the layout pattern of the second regions, or their interval or period, to the extent ensuring that no device region includes the second regions substantially. Typically, the border lines of each device region are determined to include a straight line connecting at least two adjacent second regions. In the dicing process for separation into chips, the nitride III–V compound semiconductor substrate having nitride III–V compound semiconductor layers grown thereon is preferably diced along such border lines each including the straight line connecting at least two adjacent second regions. The dicing typically relies on cleavage, but other methods using a diamond saw or a laser beam may be used alternatively for the same purpose. Especially when cleavage is employed as the dicing, the border lines of each device region, which includes a straight line connecting at least two adjacent second regions, facilitates desirable cleavage, because the second regions having an average dislocation density higher than that of the first region is weaker in mechanical strength than the first region. This is especially advantageous for obtaining desirable cavity edges of semiconductor lasers. The border lines of each device region may be determined not to pass any second regions. In this case, the border lines of each device region should preferably be distant from the second regions by at least 1 μm in order to minimize adverse influences of the second regions. Thus, in the dicing process, the nitride III–V compound semiconductor substrate having nitride III–V compound semiconductor layers grown thereon is diced along the border lines distant inside from the second regions.

The nitride III–V compound semiconductor substrate or the nitride III–V compound semiconductor layers are made of, most generally, $Al_xB_yGa_{1-x-y-z}In_zAs_uN_{1-u-v}P_v$ (where $0 \leq x \leq 1$, $0 \leq y \leq 1$, $0 \leq z \leq 1$, $0 \leq u \leq 1$, $0 \leq v \leq 1$, $0 \leq x+y+z<1$ and $0 \leq u+v<1$), or more specifically, $Al_xB_yGa_{1-x-y-z}In_zN$ (where $0 \leq x \leq 1$, $0 \leq y \leq 1$, $0 \leq z \leq 1$ and $0 \leq x+y+z<1$). Typically, they are made of $Al_xGa_{1-x-z}In_zN$ (where $0 \leq x \leq 1$ and $0 \leq z \leq 1$). Most typically, the nitride III–V compound semiconductor substrate is made of GaN.

The features and conditions set forth in conjunction with the first aspect of the invention are applicable to other aspects of the invention as well, as far as they are congruous to their natures.

The second aspect of the invention is a semiconductor light emitting device manufactured by:

growing nitride III–V compound semiconductor layers forming a light emitting device structure on a nitride III–V compound semiconductor substrate in which a plurality of second regions having a second average dislocation density higher than a first average dislocation density align regularly in a first region made of a crystal and having the first average dislocation density; and dicing the nitride III–V compound semiconductor substrate having the nitride III–V compound semiconductor layers grown thereon along border lines including at least neighboring two of the second regions.

The third aspect of the invention is a semiconductor light emitting device including nitride III–V compound semiconductor layers grown to form a light emitting device structure on a nitride III–V compound substrate in which a plurality of second regions having a second average dislocation density higher than a first average dislocation density align regularly in a first region made of a crystal and having the first average dislocation density, in which at least one of said second regions resides on an end surface or a corner of the nitride III–V compound semiconductor substrate.

The fourth aspect of the invention is method of manufacturing a semiconductor ligth emitting device by growing nitride III–V compound semiconductor layers forming a light emitting device structure on a nitride III–V compound semiconductor substrate in which a plurality of second regions having a second average defect density higher than a first average defect density align regularly in a first region made of a crystal and having the first average defect density, comprising:

defining a device region on the nitride III–V compound semiconductor substrate such that the device region does not include the second regions substantially.

The fifth aspect of the invention is a semiconductor light emitting device manufactured by:

growing nitride III–V compound semiconductor layers forming a light emitting device structure on a nitride III–V compound semiconductor substrate in which a plurality of second regions having a second average defect density higher than a first average defect density align regularly in a first region made of a crystal and having the first average defect density; and dicing the nitride III–V compound semiconductor substrate having the nitride III–V compound semiconductor layers grown thereon along border lines including at least neighboring two of the second regions.

The sixth aspect of the invention is a semiconductor light emitting device including nitride III–V compound semiconductor layers grown to form a light emitting device structure on a nitride III–V compound semiconductor substrate in which a plurality of second regions having a second average dislocation density higher than a first average dislocation density align regularly in a first region made of a crystal and having the first average dislocation density, in which at least one of said second regions resides on an end surface or a corner of the nitride III–V compound semiconductor substrate.

In the fourth, fifth and sixth aspects of the invention, the "average defect density" means the average density of entire lattice defects that will adversely affect the properties and reliability of the devices, and defects involve all kinds of defects such as dislocations, stacking faults and point defects, for example (also in the description hereunder).

The seventh aspect of the invention is a method of manufacturing a semiconductor light emitting device by growing nitride III–V compound semiconductor layers forming a light emitting device structure on a nitride III–V compound semiconductor substrate in which a plurality of second regions inferior in crystalline property to a first region align regularly in the first region made of a crystal, comprising:

defining a device region on the nitride III–V compound semiconductor substrate such that the device region does not include the second regions substantially.

The eighth aspect of the invention is a semiconductor light emitting device manufactured by:

growing nitride III–V compound semiconductor layers forming a light emitting device structure on a nitride III–V compound semiconductor substrate in which a plurality of second regions inferior in crystalline property to a first region align regularly in the first region made of a crystal; and dicing the nitride III–V compound semiconductor substrate having the nitride III–V compound semiconductor layers grown thereon along border lines including at least neighboring two of the second regions.

The ninth aspect of the invention is a semiconductor light emitting device including nitride III–V compound semiconductor layers grown to form a light emitting device structure on a nitride III–V compound substrate in which a plurality of second regions inferior in crystalline property to a first region align regularly in the first region made of a crystal, in which at least one of said second regions resides on an end surface or a corner of the nitride III–V compound semiconductor substrate.

In the seventh, eighth and ninth aspects of the invention, the crystal composing the first region is typically a single crystal, and the second regions inferior in crystallographic property to the first region are composed of a polycrystal, amorphous substance, or their mixture (also in the description hereunder). This relation corresponds to the relation between a lower average dislocation density or an average defect density of the second regions and a higher average dislocation density or an average defect density of the first region.

The tenth aspect of the invention is a method of manufacturing a semiconductor device by growing nitride III–V compound semiconductor layers forming a device structure on a nitride III–V compound semiconductor substrate in which a plurality of second regions having a second average dislocation density higher than a first average dislocation density align regularly in a first region made of a crystal and having the first average dislocation density, comprising:

defining a device region on the nitride III–V compound semiconductor substrate such that the device region does not include the second regions substantially.

The eleventh aspect of the invention is a semiconductor device manufactured by:

growing nitride III–V compound semiconductor layers forming a device structure on a nitride III–V compound semiconductor substrate in which a plurality of second regions having a second average dislocation density higher than a first average dislocation density align regularly in a first region made of a crystal and having the first average dislocation density; and dicing the nitride III–V compound semiconductor substrate having the nitride III–V compound semiconductor layers grown thereon along border lines including at least neighboring two of the second regions.

The twelfth aspect of the invention is a semiconductor device including nitride III–V compound semiconductor layers grown to form a device structure on a nitride III–V compound semiconductor substrate in which a plurality of second regions having a second average dislocation density higher than a first average dislocation density align regularly in a first region made of a crystal and having the first average dislocation density, in which at least one of said second regions resides on an end surface or a corner of the nitride III–V compound semiconductor substrate.

In the tenth to twelfth aspects of the invention, the semiconductor device may be a light emitting device such as a light emitting diode or a semiconductor laser, photodetector, or electron transport device such as a high electron mobility transistor or other type field effect transistor (FET) or a heterojunction bipolar transistor (HBT) (also in the description hereunder).

In the tenth to twelfth aspects of the invention, in order to prevent adverse influences from the second regions having a high average dislocation density, active regions of semiconductor devices are distant from the second regions by 1 µm or more, preferably by 10 µm or more, or more preferably by 100 µm or more. In case the substrate includes the third regions, it is most preferable for the active regions of the semiconductor devices to be off both the second and third regions. The active region herein means an emission region in case of a semiconductor light emitting device, a photo-detecting region in case of a semiconductor photodetector, and a region where electrons run in case of an electron transport device (also in the description hereunder).

The thirteenth aspect of the invention is a method of manufacturing a semiconductor light emitting device by growing semiconductor layers forming a light emitting device structure on a semiconductor substrate in which a plurality of second regions having a second average dislocation density higher than a first average dislocation density align regularly in a first region made of a crystal and having the first average dislocation density, comprising:

defining a device region on the semiconductor substrate such that the device region does not include the second regions substantially.

The fourteenth aspect of the invention is a semiconductor light emitting device manufactured by:

growing semiconductor layers forming a light emitting device structure on a semiconductor substrate in which a plurality of second regions having a second average dislocation density higher than a first average dislocation density align regularly in a first region made of a crystal and having the first average dislocation density; and dicing the semiconductor substrate having the semiconductor layers grown thereon along border lines including at least neighboring two of the second regions.

The fifteenth aspect of the invention is a semiconductor light emitting device including semiconductor layers grown to form a light emitting device structure on a semiconductor substrate in which a plurality of second regions having a second average dislocation density higher than a first average dislocation density align regularly in a first region made of a crystal and having the first average dislocation density, in which at least one of said second regions resides on an end surface or a corner of the semiconductor substrate.

The sixteenth aspect of the invention is a method of manufacturing a semiconductor device by growing semiconductor layers forming a device structure on a semiconductor substrate in which a plurality of second regions having a second average dislocation density higher than a first average dislocation density align regularly in a first region made of a crystal and having the first average dislocation density, comprising:

defining a device region on the semiconductor substrate such that the device region does not include the second regions substantially.

The seventeenth aspect of the invention is a semiconductor device manufactured by:

growing semiconductor layers forming a device structure on a semiconductor substrate in which a plurality of second regions having a second average dislocation density higher than a first average dislocation density align regularly in a first region made of a crystal and having the first average dislocation density; and dicing the semiconductor substrate having the semiconductor layers grown thereon along border lines including at least neighboring two of the second regions.

The eighteenth aspect of the invention is a semiconductor device including semiconductor layers grown to form a device structure on a semiconductor substrate in which a plurality of second regions having a second average dislocation density higher than a first average dislocation density align regularly in a first region made of a crystal and having the first average dislocation density, in which at least one of said second regions resides on an end surface or a corner of the semiconductor substrate.

In the thirteenth to eighteenth aspects of the invention, material of the semiconductor substrate or the semiconductor layers may be selected from nitride III–V compound semiconductors, other semiconductors having wurtzite structures, or more generally, hexagonal system crystal structures, such as ZnO, α-ZnS, α-CdS, α-CdSe, or the like, or other various semiconductors having other crystalline structures.

The nineteenth aspect of the invention is a method of manufacturing a device by growing layers forming a device structure on a substrate in which a plurality of second regions having a second average dislocation density higher than a first average dislocation density align regularly in a first region made of a crystal and having the first average dislocation density, comprising:

defining a device region on the substrate such that the device region does not include the second regions substantially.

The twentieth aspect of the invention is a device manufactured by:

growing layers forming a device structure on a substrate in which a plurality of second regions having a second average dislocation density higher than a first average dislocation density align regularly in a first region made of a crystal and having the first average dislocation density; and dicing the substrate having the layers grown thereon along border lines including at least neighboring two of the second regions.

The twenty-first aspect of the invention is a device including layers grown to form a device structure on a substrate in which a plurality of second regions having a second average dislocation density higher than a first average dislocation density align regularly in a first region made of a crystal and having the first average dislocation density, in which at least one of said second regions resides on an end surface or a corner of the substrate.

In the nineteenth to twenty-first aspects of the invention, the device may be a semiconductor device (light emitting device, photodetector electron transport device, etc.), piezoelectric element, pyroelectric device, optical device (such as secondary high-frequency generating device using a nonlinear optical crystal), dielectric device (contemplating a ferroelectric device as well), superconducting device), or the like. In case of a semiconductor device, material of the substrate or layers may be selected from various semiconductors. In case of a piezoelectric device, pyroelectric device, optical device, dielectric device, superconducting device, etc, various materials such as oxides, for example, may be used. There are lots of kinds of oxide materials including those disclosed in Journal of the Society of Japan Vol. 103, No. 11(1995) pp. 1099–1111 and Materials Science and Engineering B41 (1996) 166–173, for example.

The twenty-second aspect of the invention is a method of manufacturing a device by growing layers forming a device structure on a substrate in which a plurality of second regions having a second average dislocation density higher than a first average dislocation density align regularly in a first region made of a crystal and having the first average dislocation density, comprising:

defining a device region on the substrate such that an active region of the device does not include the second regions.

The twenty-third aspect of the invention is a device including layers grown to form a device structure on a substrate in which a plurality of second regions having a second average dislocation density higher than a first average dislocation density align regularly in a first region made of a crystal and having the first average dislocation density, in which at least one of said second regions resides inside the substrate or on an end surface or a corner of the substrate, and an active region of the device does not include the second regions.

The twenty-fourth aspect of the invention is a method of manufacturing a device by growing layers forming a device structure on a substrate in which a plurality of second regions having a second average defect density higher than a first average defect density align regularly in a first region made of a crystal and having the first average defect density, comprising:

defining a device region on the substrate such that an active region of the device does not include the second regions.

The twenty-fourth aspect of the invention is a device including layers grown to form a device structure on a substrate in which a plurality of second regions having a second average defect density higher than a first average defect density align regularly in a first region made of a crystal and having the first average defect density, in which at least one of said second regions resides inside the substrate or on an end surface or a corner of the substrate, and an active region of the device does not include the second regions.

The twenty-sixth aspect of the invention is a method of manufacturing a device by growing layers forming a device structure on a substrate in which a plurality of second regions inferior in crystalline property to a first region align regularly in the first region made of a crystal, comprising:

defining a device region on the substrate such that an active region of the device does not include the second regions.

The twenty-seventh aspect of the invention is a device including layers grown to form a device structure on a substrate in which a plurality of second regions inferior in crystalline property to a first region align regularly in a first region made of a crystal, in which at least one of said second regions resides inside the substrate or on an end surface or a corner of the substrate, and an active region of-the device does not include the second regions.

The twenty-eighth aspect of the invention is a method of manufacturing a device by growing layers forming a device structure on a substrate in which a plurality of second regions having a second average dislocation density higher than a first average dislocation density regularly align in a first region having the first average dislocation density in first intervals in a first direction and in second intervals smaller than the first intervals in a second direction normal to the first direction, comprising:

defining a device region on the substrate such that the device region does not substantially include seven or more rows of the second regions in the second direction, and an active region of the device does not include the second regions.

The twenty-ninth aspect of the invention is a device manufactured by growing layers forming a device structure on a substrate in which a plurality of second regions having a second average dislocation density higher than a first average dislocation density regularly align in a first region having the first average dislocation density in first intervals in a first direction and in second intervals smaller than the first intervals in a second direction normal to the first direction, in which the substrate does not substantially include seven or more rows of the second regions and an active region of the device does not include the second regions.

The thirtieth aspects of the invention is a method of manufacturing a device by growing layers forming a device structure on a substrate in which a plurality of second regions having a second average defect density higher than a first average defect density regularly align in a first region having the first average defect density in first intervals in a first direction and in second intervals smaller than the first intervals in a second direction normal to the first direction, comprising:

defining a device region on the substrate such that the device region does not substantially include seven or more rows of the second regions in the second direction, and an active region of the device does not include the second regions.

The thirty-first aspect of the invention is a device manufactured by growing layers forming a device structure on a substrate in which a plurality of second regions having a second average defect density higher than a first average defect density regularly align in a first region having the first average defect density in first intervals in a first direction and in second intervals smaller than the first intervals in a second direction normal to the first direction, in which the substrate does not substantially include seven or more rows of the second regions and an active region of the device does not include the second regions.

The thirty-second aspect of the invention is a method of manufacturing a device by growing layers forming a device structure on a substrate in which a plurality of second regions inferior in crystalline property to a first region regularly align in a first region in first intervals in a first direction and in second intervals smaller than the first intervals in a second direction normal to the first direction, comprising:

defining a device region on the substrate such that the device region does not substantially include seven or more rows of the second regions in the second direction, and an active region of the device does not include the second regions.

The thirty-third aspect of the invention is a device manufactured by growing layers forming a device structure on a substrate in which a plurality of second regions inferior in crystalline property to a first region regularly align in a first region in first intervals in a first direction and in second intervals smaller than the first intervals in a second direction normal to the first direction, in which the substrate does not substantially include seven or more rows of the second regions and an active region of the device does not include the second regions.

The thirty-fourth aspect of the invention is a method of manufacturing a device by growing layers forming a device structure on a substrate in which a plurality of second regions having a second average dislocation density higher than a first average dislocation density regularly align in a first region having the first average dislocation density in first intervals in a first direction and in second intervals smaller than the first intervals in a second direction normal to the first direction, comprising:

defining a device region on the substrate such that the first interval is 50 μm or more, one or more rows of the second regions in the second direction are included, and an active region of the device does not include the second regions.

The thirty-fifth aspect of the invention is a device manufactured by growing layers forming a device structure on a substrate in which a plurality of second regions having a second average dislocation density higher than a first average dislocation density regularly align in a first region having the first average dislocation density in first intervals in a first direction and in second intervals smaller than the first intervals in a second direction normal to the first direction, in which the first interval is 50 μm or more, one or more rows of the second regions in the second direction is included, and an active region of the device does not include the second regions.

The thirty-sixth aspect of the invention is a method of manufacturing a device by growing layers forming a device structure on a substrate in which a plurality of second regions having a second average defect density higher than a first average defect density regularly align in a first region having the first average defect density in first intervals in a first direction and in second intervals smaller than the first intervals in a second direction normal to the first direction, comprising:

defining a device region on the substrate such that the first interval is 50 μm or more, one or more rows of the second regions in the second direction is included, and an active region of the device does not include the second regions.

The thirty-seventh aspect of the invention is a device manufactured by growing layers forming a device structure on a substrate in which a plurality of second regions having a second average defect density higher than a first average defect density regularly align in a first region having the first average defect density in first intervals in a first direction and in second intervals smaller than the first intervals in a second direction normal to the first direction, in which the first interval is 50 μm or more, one or more rows of the second regions in the second direction is included, and an active region of the device does not include the second regions.

The thirty-eighth aspect of the invention is a method of manufacturing a device by growing layers forming a device structure on a substrate in which a plurality of second regions inferior in crystalline property to a first region align in a first region in first intervals in a first direction and in second intervals smaller than the first intervals in a second direction normal to the first direction, comprising:

defining a device region on the substrate such that the first interval is 50 μm or more, one or more rows of the second regions in the second direction are included, and an active region of the device does not include the second regions.

The thirty-ninth aspect of the invention is a device manufactured by growing layers forming a device structure on a substrate in which a plurality of second regions inferior in crystalline property to a first region regularly align in a first region in first intervals in a first direction and in second intervals smaller than the first intervals in a second direction normal to the first direction, in which the first interval is 50 μm or more, one or more rows of the second regions in the second direction is included, and an active region of the device does not include the second regions.

The fortieth aspect of the invention is a method of manufacturing a device by growing layers to form a device structure on a substrate in which a plurality of second regions having a second average dislocation density higher than a first average dislocation density and extending linearly align regularly in parallel to each other in a first region made of a crystal having the first average dislocation density, comprising:

defining a device region not to include seven or more of the second regions and not to include the second regions in an active region of the device.

The forty-first aspect of the invention is a device manufactured by growing layers forming a device structure on a substrate in which a plurality of second regions having a second average dislocation density higher than a first average dislocation density align regularly in a first region made of a crystal and having the first average dislocation density, in which the device region does not substantially include seven or more rows of the second regions in the second direction, and an active region of the device does not include the second regions.

The forty-second aspect of the invention is a method of manufacturing a device by growing layers to form a device structure on a substrate in which a plurality of second regions having a second average defect density higher than a first average defect density and extending linearly align regularly in parallel to each other in a first region made of a crystal having the first average defect density, comprising:

defining a device region not to-include seven or more of the second regions and not to include the second regions in an active region of the device.

The forty-third aspect of the invention is a device manufactured by growing layers forming a device structure on a substrate in which a plurality of second regions having a second average defect density higher than a first average defect density align regularly in a first region made of a crystal and having the first average defect density, in which the device region does not substantially include seven or more rows of the second regions in the second direction, and an active region of the device does not include the second regions.

The forty-fourth aspect of the invention is a method of manufacturing a device by growing layers to form a device structure on a substrate in which a plurality of second regions inferior in crystalline property to a first region and extending linearly align regularly in parallel to each other in a first region made of a crystal having the first average dislocation density, comprising:

defining a device region not to include seven or more of the second regions and not to include the second regions in an active region of the device.

The forty-fifth aspect of the invention is a device manufactured by growing layers forming a device structure on a substrate in which a plurality of second regions inferior in crystalline property to a first region align regularly in a first region made of a crystal, in which the device region does not substantially include seven or more rows of the second regions in the second direction, and an active region of the device does not include the second regions.

The forty-sixth aspect of the invention is a method of manufacturing a device by growing layers to form a device structure on a substrate in which a plurality of second regions having a second average dislocation density higher than a first average dislocation density and extending linearly align regularly in parallel to each other in a first region made of a crystal having the first average dislocation density, comprising:

defining a device region such that the interval of the second regions is 50 μm or more, one or more of the second regions are included, and an active region of the device does not include the second regions.

The forty-seventh aspect of the invention is a device manufactured by growing layers forming a device structure on a substrate in which a plurality of second regions having a second average dislocation density higher than a first average dislocation density align regularly in a first region made of a crystal and having the first average dislocation density, in which the interval of the second regions is 50 μm or more, one or more of the second regions are included, and an active region of the device does not include the second regions.

The forty-eighth aspect of the invention is a method of manufacturing a device by growing layers to form a device structure on a substrate in which a plurality of second regions having a second average defect density higher than a first average defect density and extending linearly align regularly in parallel to each other in a first region made of a crystal having the first average defect density, comprising:

defining a device region such that the interval of the second regions is 50 μm or more, one or more of the second regions are included, and an active region of the device does not include the second regions.

The forty-ninth aspect of the invention is a device manufactured by growing layers forming a device structure on a substrate in which a plurality of second regions having a second average defect density higher than a first average defect density align regularly in a first region made of a crystal and having the first average defect density, in which the interval of the second regions is 50 μm or more, one or more of the second regions are included, and an active region of the device does not include the second regions.

The fiftieth aspect of the invention is a method of manufacturing a device by growing layers to form a device structure on a substrate in which a plurality of second regions inferior in crystalline property to a first region and extending linearly align regularly in parallel to each other in a first region made of a crystal, comprising:

defining a device region such that the interval of the second regions is 50 μm or more, one or more of the second regions are included, and an active region of the device does not include the second regions.

The fifty-first aspect of the invention is a device manufactured by growing layers forming a device structure on a substrate in which a plurality of second regions inferior in crystalline property to a first region align regularly in a first region made of a crystal, in which the interval of the second regions is 50 μm or more, one or more of the second regions are included, and an active region of the device does not include the second regions.

The features and conditions set forth in conjunction with the first to twenty-first aspects of the invention are applicable to the twenty-second to twenty-seventh aspects of the invention as well, as far as those features are congruous to the natures of the twenty-second to twenty-seventh aspects of the invention.

In the twenty-eighth to thirty-third aspects and fortieth to forty-fifth aspects of the invention, the interval of the second regions in the first direction (first interval) or the interval of the second regions extending straight are equivalent to the interval of the second regions or the alignment interval of the second regions set forth in conjunction with the first aspect of the invention. In the thirty-fourth to thirty-ninth aspects of the invention, the interval of the second regions in the first direction (first interval) or the interval of the second regions extending straight are equivalent to the interval of the second regions or the alignment interval of the second regions set forth in conjunction with the first aspect of the invention excepting that its lower limit is 50 μm. In the twenty-eighth to thirty-ninth aspects of the invention, the interval between the second regions in the second direction may be determined basically freely within the range smaller than the first distance. Although depending upon the size of each second region, the interval is generally from 10 μm to 1000 μm and typically from 20 μm to 200 μm. In the twenty-eighth to thirty-third aspects and fortieth to forty-fifth aspects of the invention, the number of rows of the second regions in the second direction or the number of second regions extending straight is limited to seven in maximum. This is because the device region may possibly include seven or so second regions in relation to the chip size of the device, depending upon the interval between the rows of the second regions in the second direction or between the second regions extending straight. The number of rows of the second regions in the second direction or the number of second regions extending straight is typically three or less in a semiconductor light emitting device usually having a small chip size.

The features and conditions set forth in conjunction with the first to twenty-first aspects of the invention are applicable to the twenty-second to fifty-first aspects of the invention as well, as far as those features are congruous to the natures of the twenty-second to fifty-first aspects of the invention.

According to the invention having the above-summarized features, device regions are defined on the nitride III–V compound semiconductor substrate, other semiconductor substrate or any kind of substrate such that active regions of devices do not substantially include the second regions higher in average dislocation density, higher in average defect density or inferior in crystalline property to the first region. Therefore, even when some defects such as dislocations propagate to nitride III–V compound semiconductor layers, other semiconductor layers or layers of any other various kinds of materials that are deposited for forming light emitting structures or other device structures, it is ensured that chips obtained by dicing the substrate include substantially no dislocations or other defects.

DETAILED DESCRIPTION OF THE PRESENTLY PREFERRED EMBODIMENTS

Figure 1A:
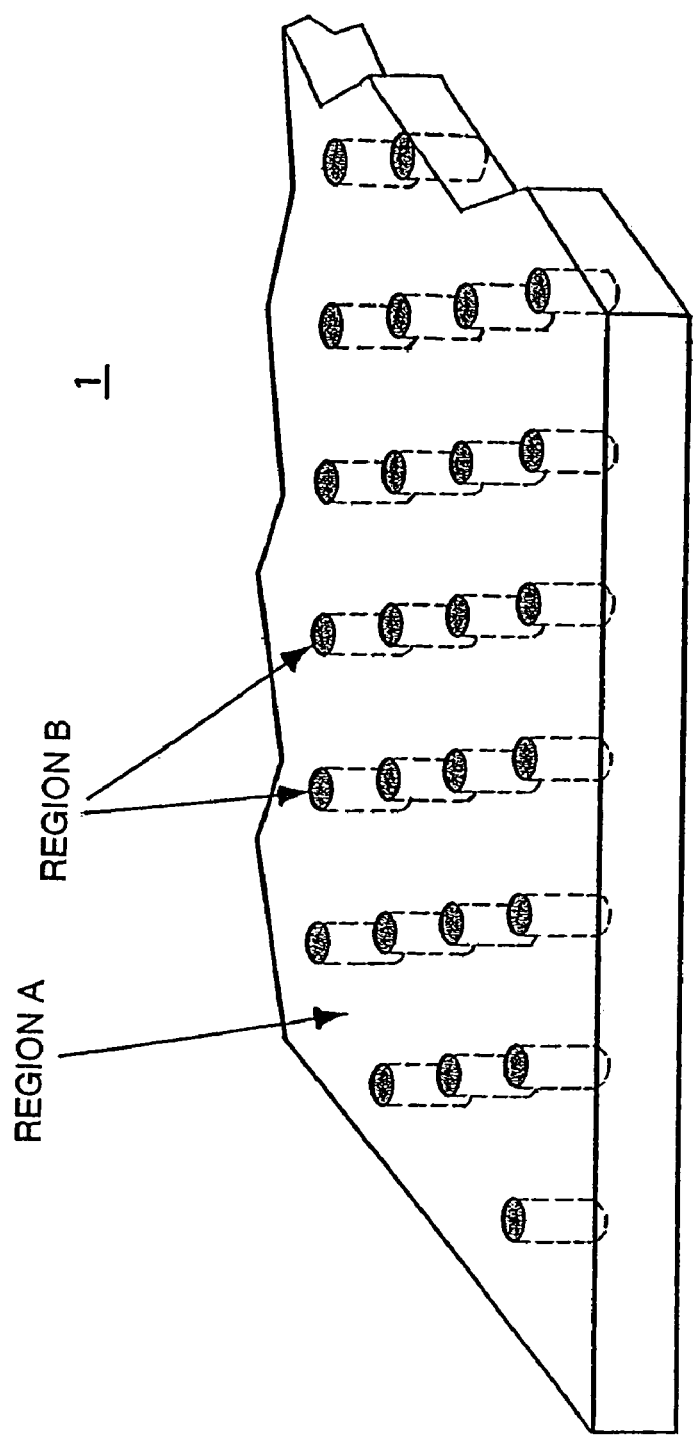
FIGS. 1A and 1B are a perspective view and a cross-sectional view for explaining the essence of an embodiment of the invention.

Explained below are embodiments of the invention with reference to the drawings. In all figures illustrating the embodiments, identical or equivalent components are labeled with common reference numerals.

Figure 1B:
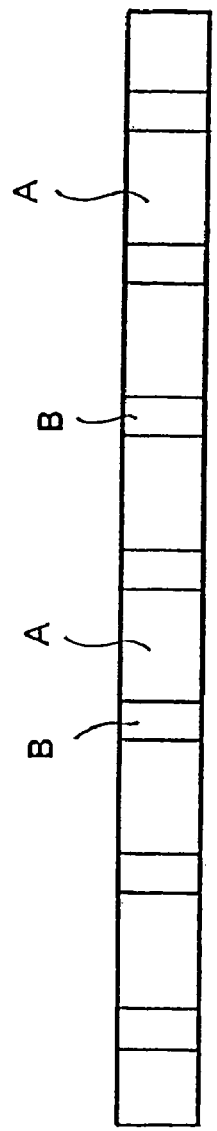

The embodiment explained below is directed to a case using a substrate including a region A of a certain crystal and regions B having a crystallographic property different from the region A and periodically aligned in form of islands in the region A as shown in FIG. 1A, and forming semiconductor devices on the substrate. The regions B penetrate the substrate. The regions are inferior to the region in terms of crystalline quality, and contain more crystal defects. FIG. 1B shows a cross-sectional view taken along a line where the regions B appear closest to each other. Although each region B generally has an arbitrary polygonal prismatic shape, FIG.

1 shows them in form of circular cylinders for simplicity (also in the description hereunder). When a semiconductor laser is manufactured, semiconductor layers composing a device structure are sequentially grown on the substrate by metal-organic chemical vapor deposition (MOCVD), hydride vapor phase epitaxial growth, halide vapor phase epitaxial growth (HVPE), or the like. Then, through further necessary steps of forming electrodes, etc. and thereafter dividing the substrate and the semiconductor layers thereon into chips by dicing them by cleavage, for example, intended semiconductor devices are obtained.

In the manufacturing process, crystal defects of the base substrate propagate to the semiconductor layers grown thereon. Therefore, the semiconductor layers accumulating on device regions containing regions B will be affected by influences of the defects, and will be inferior in property. For example, in case of a light emitting diode or a semiconductor laser, if those defects exist in its emission region, then its emission property and reliability will be damaged. Thus, to prevent the emission region, more broadly the active region, from adverse affection of the regions B, the following techniques are used.

(1) When the device is designed, its size is determined in accord with the period of alignment of the regions B.

Figure 2:
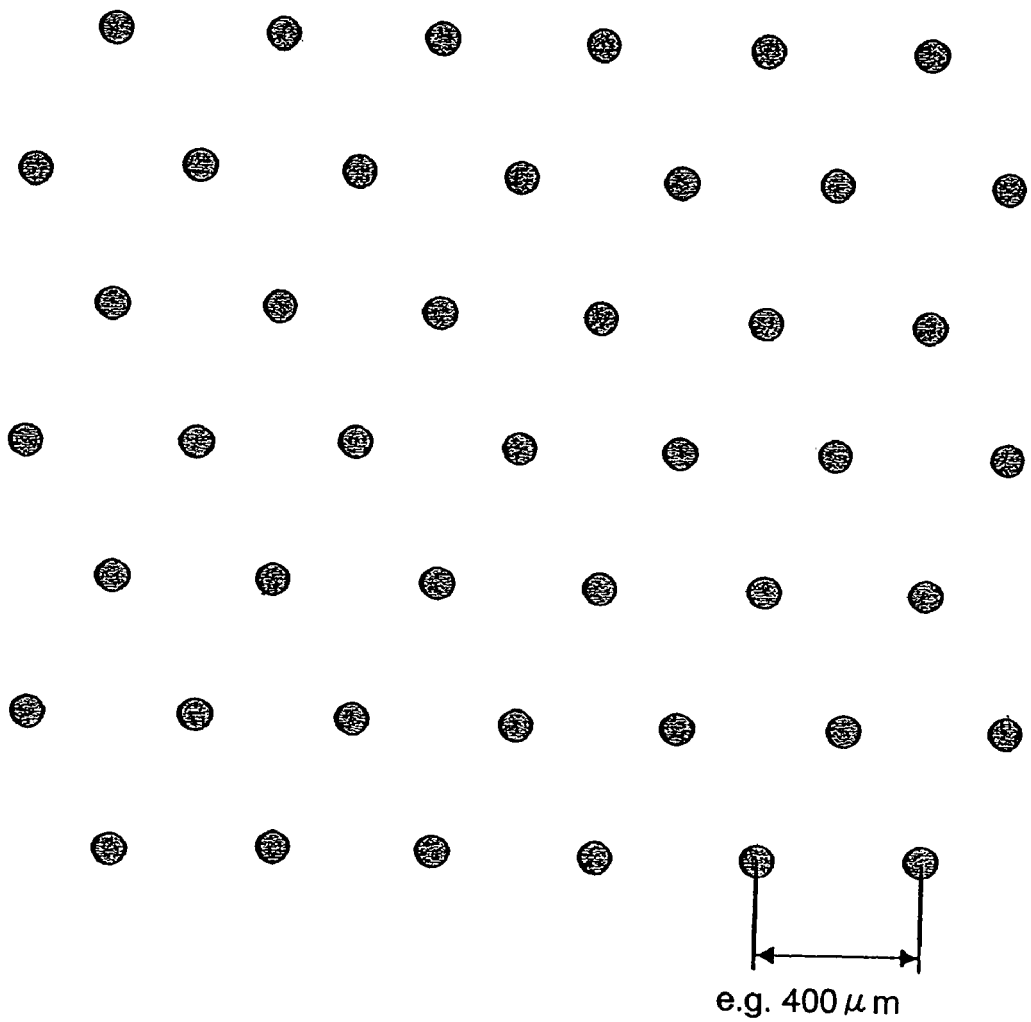
FIG. 2 is a plan view for explaining the essence of an embodiment of the invention.

For example, in case the regions B periodically align in equal intervals in form of hexagonal lattices as shown in FIG. 2 and the distance between the centers of nearest two regions B is 400 µm, each device region is defined in form of a rectangular shape of 400×346 µm. The value, 346 µm, is equal to 400 µm×($3^{1/2}/2$).

(2) Location of each device region is determined to ensure that the device region does not lie on any of the regions B substantially, that is, to ensure that the device region includes substantially no region B.

Figure 3:
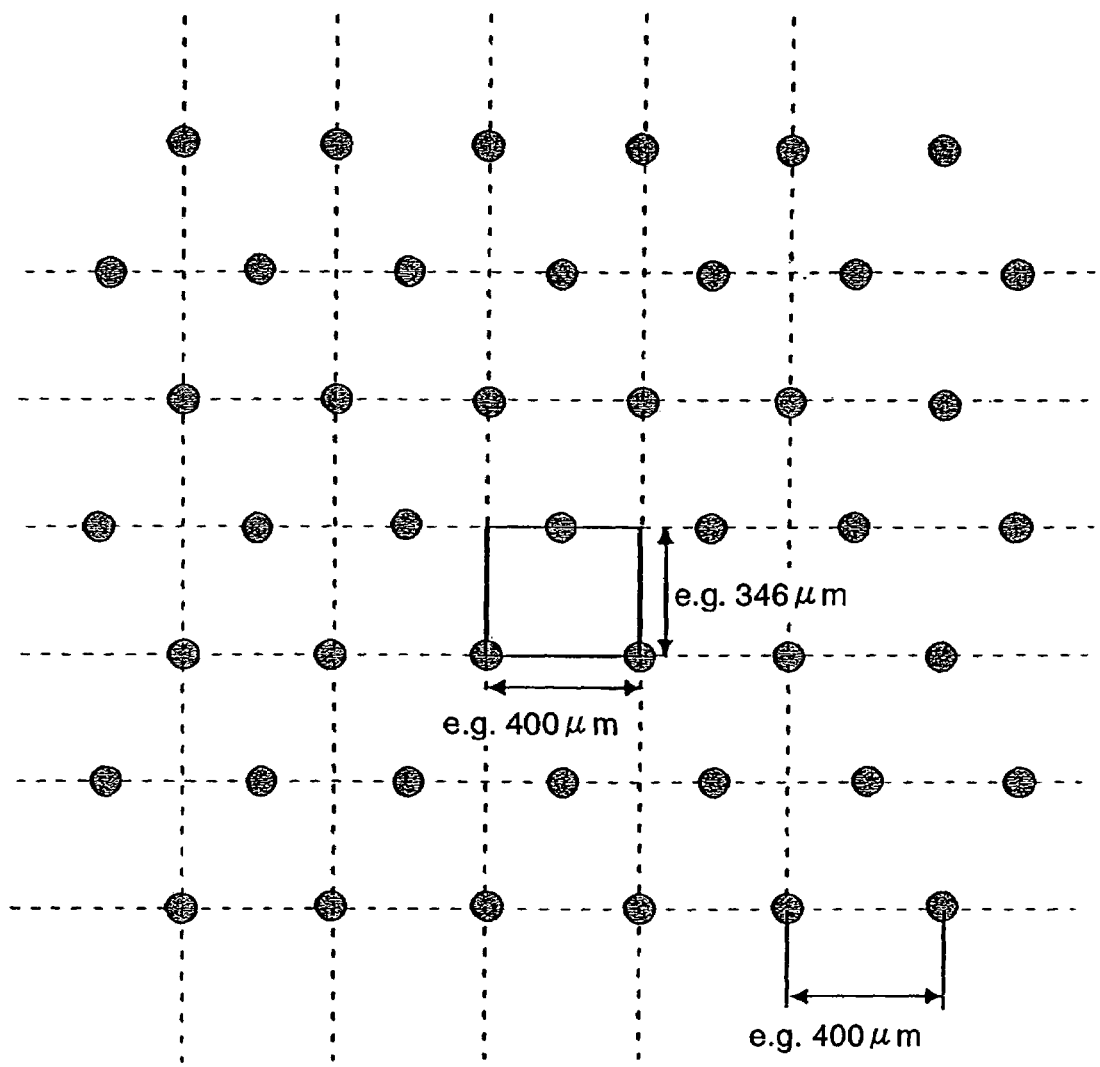
FIG. 3 is a plan view for explaining the essence of an embodiment of the invention.

Each device region, which is rectangular and sized 400×346 µm, is divided as a chip by dicing the substrate along the broken lines in FIG. 3, for example. Thus, the regions B are permitted to exist on end surfaces and corners of each semiconductor device.

(3) When the device is designed, position of the active region inside the device is determined not to lie on any of the regions B.

Figure 4:
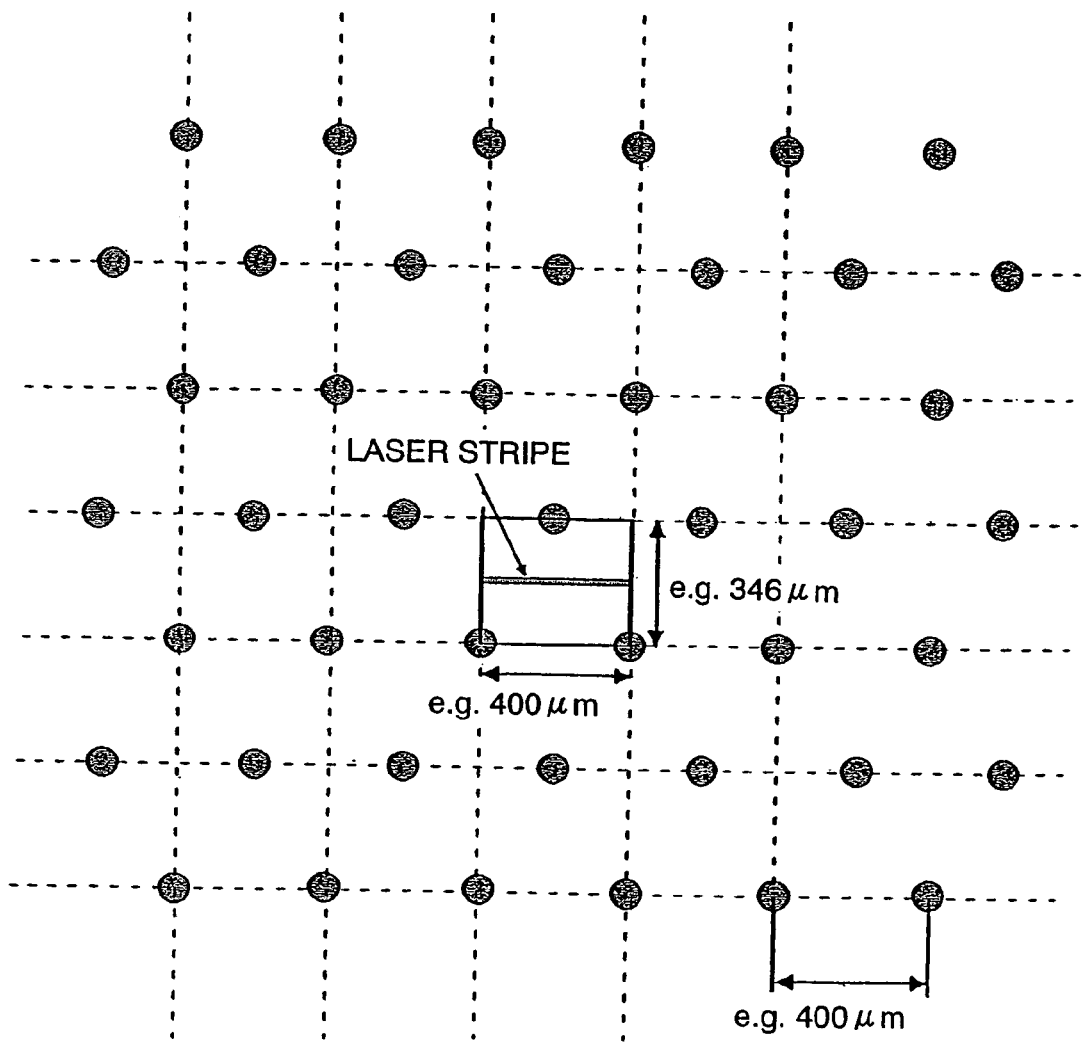
FIG. 4 is a plan view for explaining the essence of an embodiment of the invention.

In case the device is a semiconductor laser, its emission region is stripe-shaped in most cases. In this case, structure of the semiconductor laser is designed to ensure that the stripe does not lie on any of the regions B. FIG. 4 shows an example of such placement of the stripe.

By following the technique and procedures set forth in (1) through (3) above, each device region can be defined in a location intentionally avoiding adverse affections by the regions B having more defects.

Especially when the device is a semiconductor laser, additional attention is paid to ensure that the cavity edges of its emission region does not lie on any of the regions B when the device region or device structure is designed.

Figure 5:
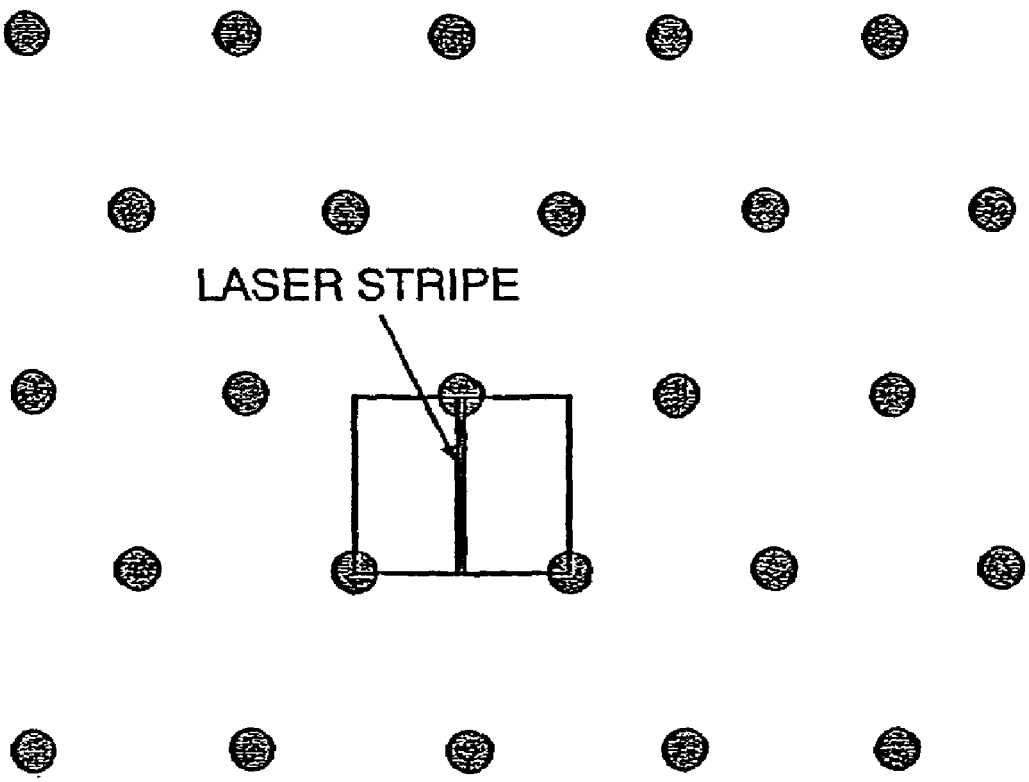
FIG. 5 is a plan view for explaining the essence of an embodiment of the invention.

In case of a semiconductor laser, end surfaces of the chip serve as its cavity edges. Therefore, if the portion serving as the mirror of the cavity overlaps the regions B having lots of crystal defects as shown in FIG. 5, then the laser property will be lost. Therefore, position of the emission region and location of the device region on the substrate are determined when designed to ensure that the mirror portion of the cavity does not overlap the regions B.

In the item (1) above, the rectangular shape sized 400×346 µm is one of examples, and any other sizes and shapes may be selected for devices to satisfy the conditions set forth in items (2) and (3).

The first embodiment of the invention will now be explained below. In the first embodiment, a GaN compound semiconductor laser is formed by growing GaN compound semiconductor layers on a GaN substrate in which regions B composed of a crystal having a high average dislocation density are regularly aligned in a region A composed of a crystal having a low average dislocation density.

Figure 6:
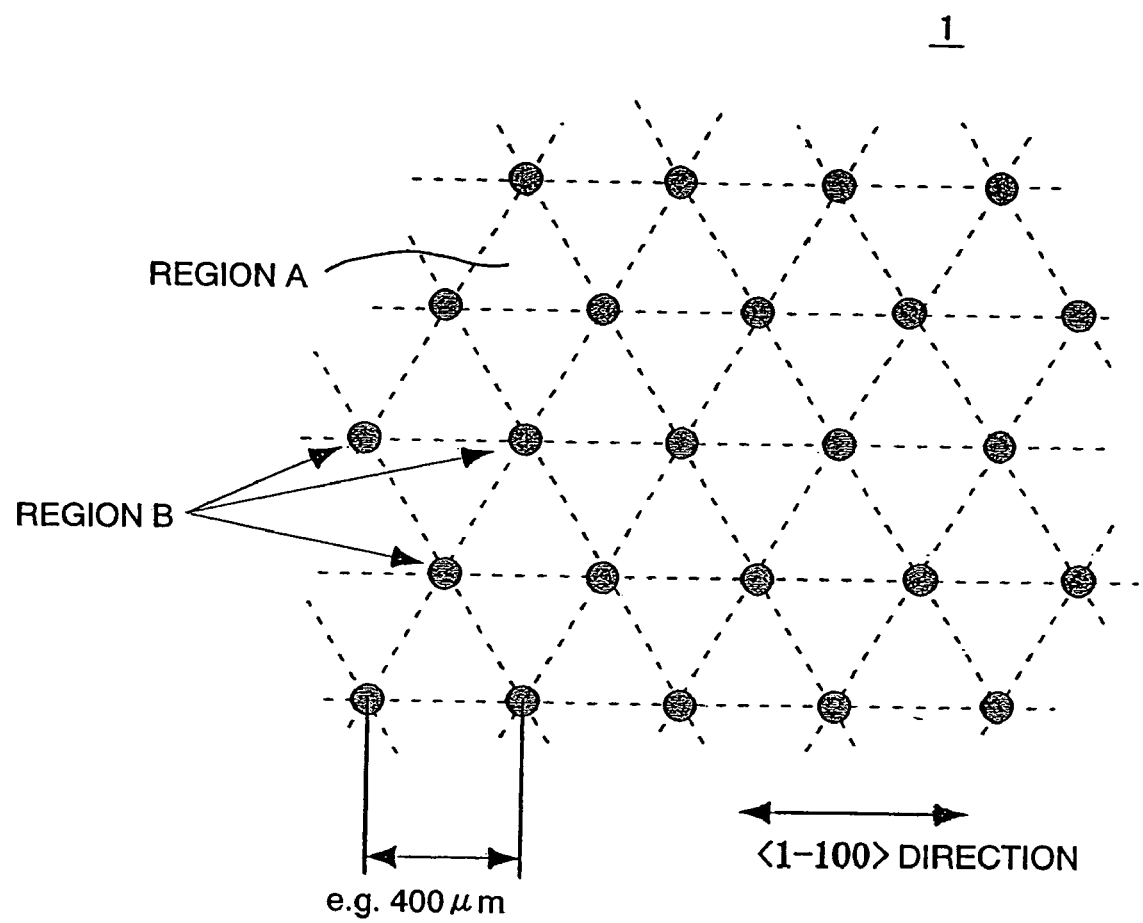
FIG. 6 is a plan view for explaining a method of manufacturing a GaN compound semiconductor laser according to the first embodiment of the invention.

FIG. 6 is a plan view showing the GaN substrate used in the first embodiment. Perspective and cross-sectional views of the GaN substrate 1 appear as shown in FIGS. 1A and 1B. The GaN substrate 1 is an n-type substrate having a (0001) plane (C-plane) orientation. The GaN substrate 1, however, may be of an R-plane, A-plane or M-plane orientation. In the GaN substrate 1, regions B composed of a crystal having a high average dislocation density periodically align in form of hexagonal lattices in the region A having a low average dislocation density. In this case, the straight line connecting nearest two regions B coincides with the <1-100> orientation of GaN or its equivalent. Alternatively, the straight line connecting nearest two regions B may coincide with the <11-20> orientation or its equivalent of GaN. The regions B penetrate the GaN substrate 1. Thickness of the GaN substrate 1 is 200–600 µm, for example. Broken lines in FIG. 6 are shown only for demonstrating relative positional relations among the regions B, and they are not real (physically significant) lines (also in the description hereunder).

Figure 7:
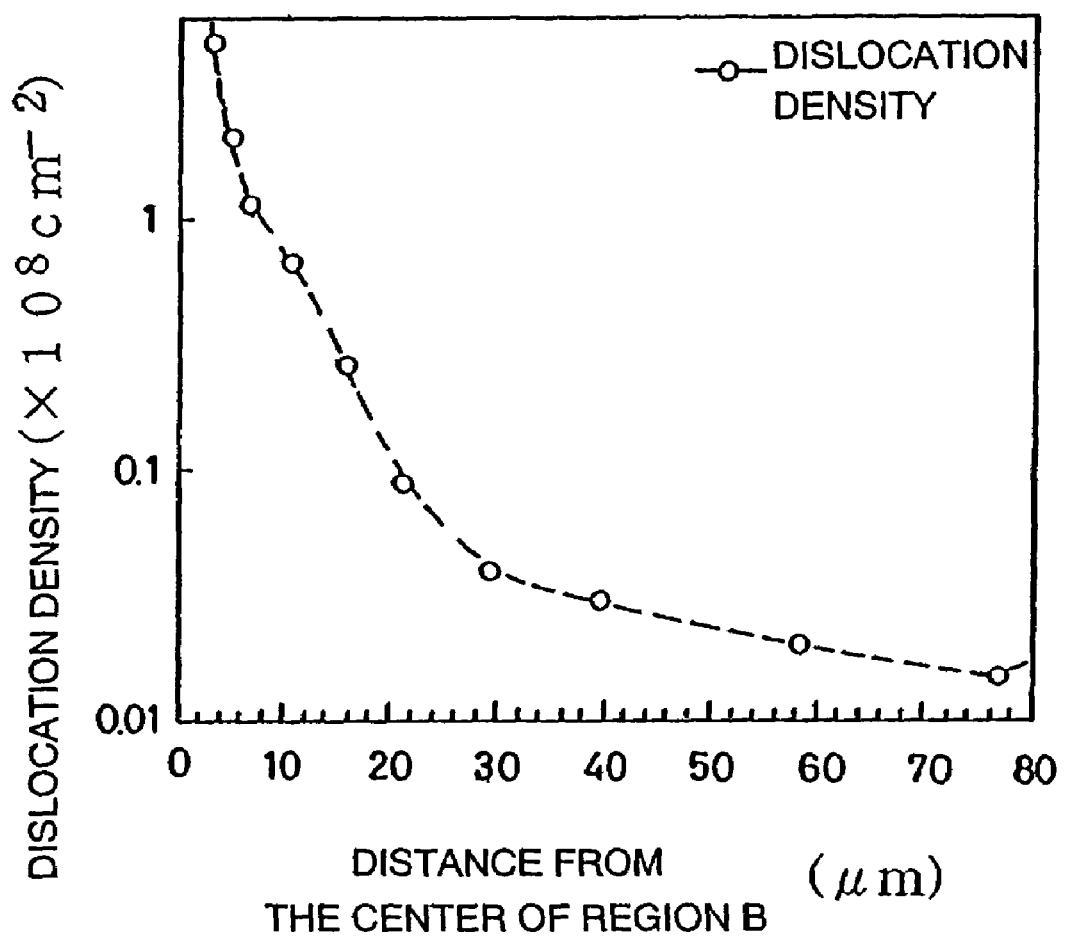
FIG. 7 is a schematic diagram showing an exemplary distribution of dislocation density near a high defect region of a GaN substrate used in the first embodiment of the invention.

The period of alignment of the regions B (intervals between the centers of nearest two regions B) is 400 µm, and diameter of each region B is 20 µm, for example. Average dislocation density of the region A is $2\times10^6$ cm$^{-2}$, and average dislocation density of the regions B is $1\times10^8$ cm$^{-2}$. FIG. 7 shows an example of distribution of the dislocation density of the regions B in radial directions of their centers.

The GaN substrate 1 can be manufactured by using a crystal growth technique in the following manner, for example.

Basic mechanism of crystal growth used for manufacturing the GaN substrate 1 is to grow it to have an oblique surface composed of facets and progress the growth while maintaining the oblique surface of facets so that dislocations propagate and concentrate to predetermined positions. Regions grown with facets become low-density defect regions due to movement of dislocations. In the lower portion of the oblique surface of facets, growth progresses to include high-density defect regions having clear boundaries. Dislocations concentrate onto boundaries with high-density defect regions or inside them, and disappear or accumulate there.

Depending upon the shapes of high-density defect regions, facets exhibit different shapes. In case a defect region is dot-shaped, facets surrounds the dot as the bottom, and form a pit composed of facets. In case a defect region is stripe-shaped, oblique surfaces of facets are formed on opposite sides of the stripe as the valley bottom just like two facets of a laid-down triangular prism.

After that, the top surface of the growth layer is treated by cutting and polishing to flatten it. Thus, the GaN substrate 1 is ready for use as the substrate.

The high-density defect regions may have some different states. For example, they may be polycrystals. In one case, they may be monocrystals which, however, are slightly slanted with respect to low-density defect regions around them. In another case, their C-axes may be inverted with respect to low-density defect regions around them. In this fashion, the high-density defect regions have clear boundaries and are distinguished from their surround.

By the growth maintaining the high-density defect regions, it is possible to grow the substrate without burying the facets around the high-density defect regions so as to maintain the facets.

The high-density defect regions can be generated by forming seeds beforehand at positions where the high-density defect regions should be formed by crystal growth of GaN on a base substrate. As these seeds, an amorphous or polycrystalline layers are formed. Thus, by growing GaN thereon, high-density defect regions can be formed just in the regions of the seeds.

A concrete manufacturing method of the GaN substrate is explained below. First, a base substrate is prepared. The base substrate may be selected from various kinds of substrates. It may be a typically sapphire substrate. However, for removal in a later process, a GaAs substrate easy to remove is preferably used. Then, seeds of $SiO_2$ films, for example, on the base substrate. The seeds may be dot-shaped or stripe-shaped, for example. A desired number of seeds can be formed in regular alignment. More specifically, the seeds are formed in alignment corresponding to the alignment of the regions B shown in FIG. 6 in this case. After that, GaN is grown thick by hydride vapor-phase epitaxy (HVPE), for example. As a result, facets corresponding to the pattern of the seeds appear on the surface of the thick layer of GaN obtained by the growth. In case the seeds have a pattern of dots, pits made by facets are regularly formed. In case the seeds exhibit a pattern of stripes, facets just like those of prisms appear.

After that, the base substrate is removed, and the top surface of the GaN thick layer is flattened by cutting and polishing. As a result, the GaN substrate 1 is obtained. Thickness of the GaN substrate 1 may be determined as desired.

The GaN substrate 1 manufactured as explained above has a C-plane as its major surface, and includes therein dot-shaped (or stripe-shaped) high-density defect regions, i.e. Regions B, of a predetermined size, which are aligned regularly. The single-crystal region, i.e. the region A, which is the remainder part excluding the regions B, has a lower dislocation density than the regions B.

In the first embodiment, device regions 2 of the illustrated geometry (individual sections bounded with the thick solid lines) are defined on the GaN substrate 1 shown in FIG. 1 in the location shown in FIG. 7. Then, GaN compound semiconductor layers composing laser structures are grown on the GaN substrate 1, and through steps of forming laser stripes and as well as other necessary steps, laser structures are formed. Thereafter, the GaN substrate 1 having the laser structures thereon is divided to discrete GaN compound semiconductor laser chips by dicing the substrate along the border lines of individual device regions 2.

Figure 8:
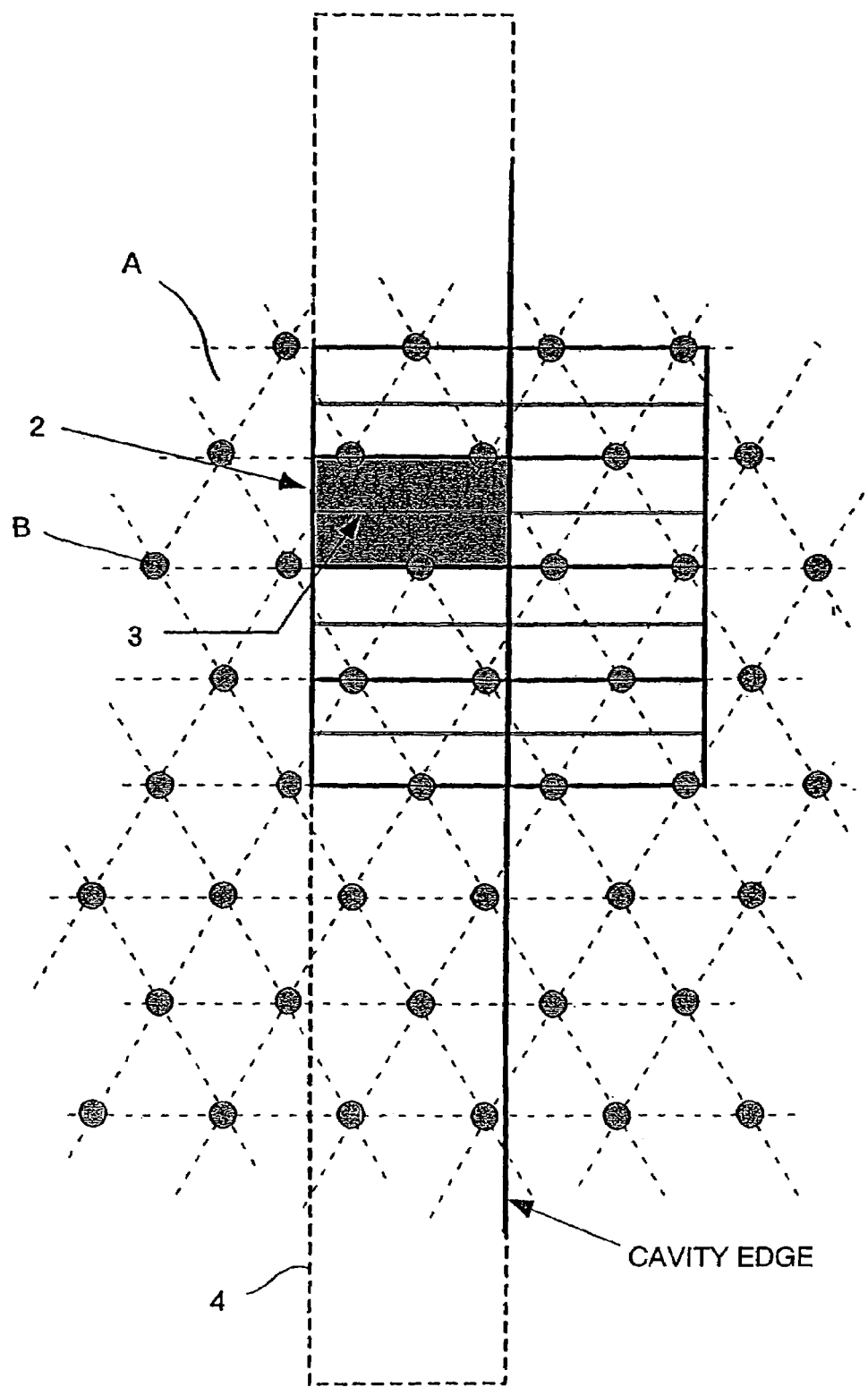
FIG. 8 is a plan view for explaining the method of manufacturing the GaN compound semiconductor laser according to the first embodiment of the invention.

In FIG. 8, the dark rectangle corresponds to a single GaN compound semiconductor laser, and the straight line passing its central part shows the laser stripe 3 that corresponds to the position of the emission region. The rectangle bounded by the solid lines and broken lines and broken lines continuous therefrom correspond to a laser bar 4, and the longer sides of the laser bar 4 correspond to cavity edges.

In the example of FIG. 8, the GaN compound semiconductor laser is sized 600×346 μm, for example. The substrate is divided to discrete GaN compound semiconductor lasers of this size by dicing the substrate along straight lines connecting regions B in the horizontal direction (lengthwise directions of the lasers) and long straight lines not passing regions B in the vertical direction (parallel to the shorter sides of the lasers).

In this case, regions B can reside only on side surfaces of longer sides of each GaN compound semiconductor laser. Therefore, by designing the devices such that their laser stripes 3 each extend near the straight line of midpoints of the shorter sides, Influences of the regions B to the emission regions can be prevented.

Cavity mirrors are formed on edges by dicing the substrate by cleavage, or the like, along the vertical straight lines in FIG. 8. Since these straight lines do not pass any of the regions B, the cavity mirrors are not affected by dislocations in the regions B. Therefore, GaN compound semiconductor lasers excellent in emission property and enhanced in reliability can be obtained.

An exemplary of concrete structure of the GaN compound semiconductor laser and an example of its manufacturing process are explained below. Assume here that the GaN compound semiconductor laser has a ridge structure and a SCH structure (separate confinement heterostructure).

Figure 9:
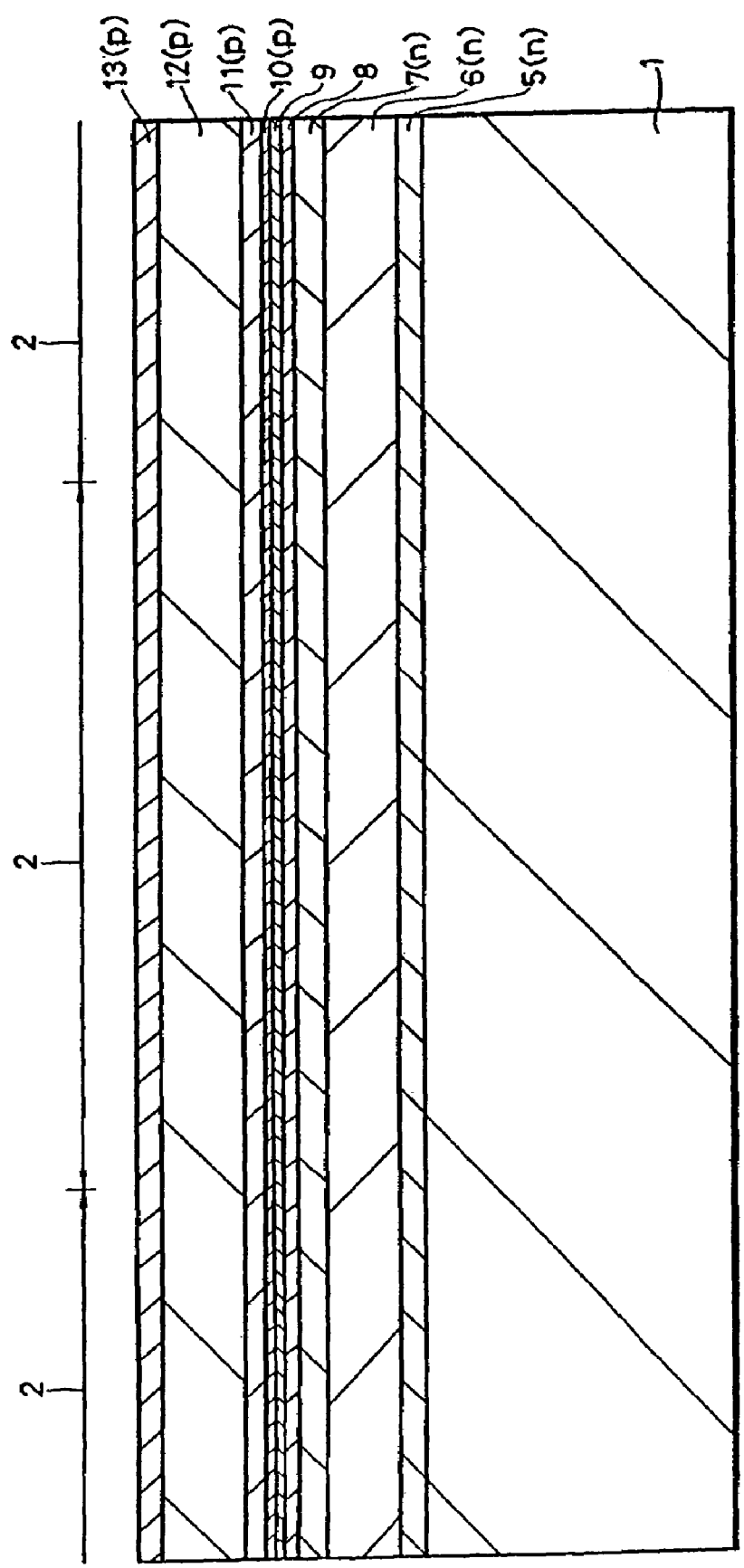
FIG. 9 is a cross-sectional view for explaining the method of manufacturing the GaN compound semiconductor laser according to the first embodiment of the invention.

As shown in FIG. 9, the top surface of the GaN substrate 1 is cleaned by thermal cleaning, for example. After that, an n-type GaN buffer layer 5, n-type AlGaN clad layer 6, n-type GaN optical guide layer 7, active layer 8 having an undoped $Ga_{1-x}In_xN/Ga_{1-y}In_yN$ multiquantum well structure, undoped InGaN deterioration preventive layer 9, p-type AlGaN cap layer 10, p-type GaN optical guide layer 11, p-type AlGaN clad layer 2 and p-type GaN contact layer 13 are epitaxially grown on that GaN substrate 1 by MOCVD.

The n-type GaN buffer layer 5 is 0.05 μm thick, for example, and it is doped with Si, for example, as its n-type impurity. The n-type AlGaN clad layer 7 is 1.0 μm thick, and it is doped with Si, for example, as its impurity. Its Al composition may be 0.08, for example. The n-type GaN optical guide layer 7 is 0.1 μm thick, for example, and it is doped with Si, for example, as its n-type impurity. In the active layer 8 having the undoped $Ga_{1-x}In_xN/Ga_{1-y}In_yN$ multiquantum well structure, each $In_xGa_{1-x}N$ layer as the well layer is 3.5 nm thick and x=0.14 whereas each $In_yGa_{1-y}N$ layer as the barrier layer is 7 nm thick and y=0.02. The active layer 8 includes three well layers.

The undoped InGaN deterioration preventive layer 9 has a graded structure in which the In composition gradually, monotonously decreases from the surface in contact with the active layer 8 toward the surface in contact with the p-type AlGaN cap layer 9. The surface in contact with the active layer 8 is equal in In composition to the In composition y of the $In_yGa_{1-y}N$ layer as the barrier layer of the active layer 8. In composition of the surface in contact with the p-type AlGaN cap layer 10 is zero. Thickness of the undoped InGaN deterioration preventive layer 9 may be 20 nm, for example.

The p-type AlGaN cap layer 10 is 10 nm thick, for example, and it is doped with magnesium (Mg), for example, as its p-type impurity. Al composition of the p-type AlGaN cap layer 10 is 0.2, for example. The p-type AlGaN cap layer 10 functions not only to prevent deterioration of the active layer 8 by elimination of In during growth of the p-type GaN optical guide layer 11 and the p-type AlGaN cap layer 11 but also to prevent overflow of carriers (electrons) from the active layer. The p-type GaN optical guide layer is 0.1 μm thick, for example, and it is doped with Mg, for example, as its p-type impurity. The p-type AlGaN clad layer 12 is 0.5 μm thick, for example, and it is doped with Mg, for example, as its p-type impurity. Al composition of the layer 12 may be 0.08, for example. The p-type GaN contact layer 13 is 0.1 μm thick, for example.

For the n-type GaN buffer layer 5, n-type AlGaN clad layer 6, n-type GaN optical guide layer 7, undoped InGaN deterioration preventive layer 9, p-type AlGaN cap layer 10, p-type GaN optical guide layer 11, p-type AlGaN clad layer 2 and p-type GaN contact layer 13, which are layers not containing In, the growth temperature may be around 1000° C., for example. For the active layer 8 having the undoped $Ga_{1-x}In_xN/Ga_{1-y}In_yN$ multiquantum well structure, the growth temperature may be 700~800° C. For example, it may be 730° C. For the undoped InGaN deterioration preventive layer 9, the growth temperature is adjusted to 730° C., for example, equally to the growth temperature of the active layer 8 at the start of its growth, and it is thereafter increased linearly, for example, to reach 835° C. equal to the growth temperature of the p-type AlGaN cap layer 10 at the end of its growth.

Source materials for growth of these GaN compound semiconductor layers may be, for example, trimethyl gallium $((CH_3)_3Ga, TMG)$ as the material of Ga, trimethyl aluminum $((CH_3)_3Al, TMA)$ as the material of Al, trimethyl indium $((CH_3)_3In, TMI)$ as the material of In and $NH_3$ as the material of N. The carrier gas may be $H_2$, for example. Dopants may be, for example, monosilane $(SiH_4)$ as the n-type dopant, and bis=methylcyclopentadienile magnesium $((CH_3C_5H_4)_2Mg)$ or bis=cyclopentadienile magnesium $((C_5H_5)_2Mg)$ as the p-type dopant.

In the next process, the c-plane sapphire substrate having those GaN compound semiconductor layers grown thereon as explained above is removed from the MOCVD apparatus. Then, after a $SiO_2$ film (not shown), 0.1 μm thick for example, is formed on the entire surface of the p-type GaN contact layer 13 by CVD, vacuum evaporation or sputtering, for example, a resist pattern (not shown) of a predetermined configuration corresponding to the shape of the ridge portion is formed on the $SiO_2$ film by lithography. Next using this resist pattern as a mask, the $SiO_2$ film is selectively etched to a pattern corresponding to the ridge portion by wet etching using a hydrofluoric acid-based etching liquid, or RIE using an etching gas containing fluorine such as $CF_4$ or $CHF_3$.

Figure 10:
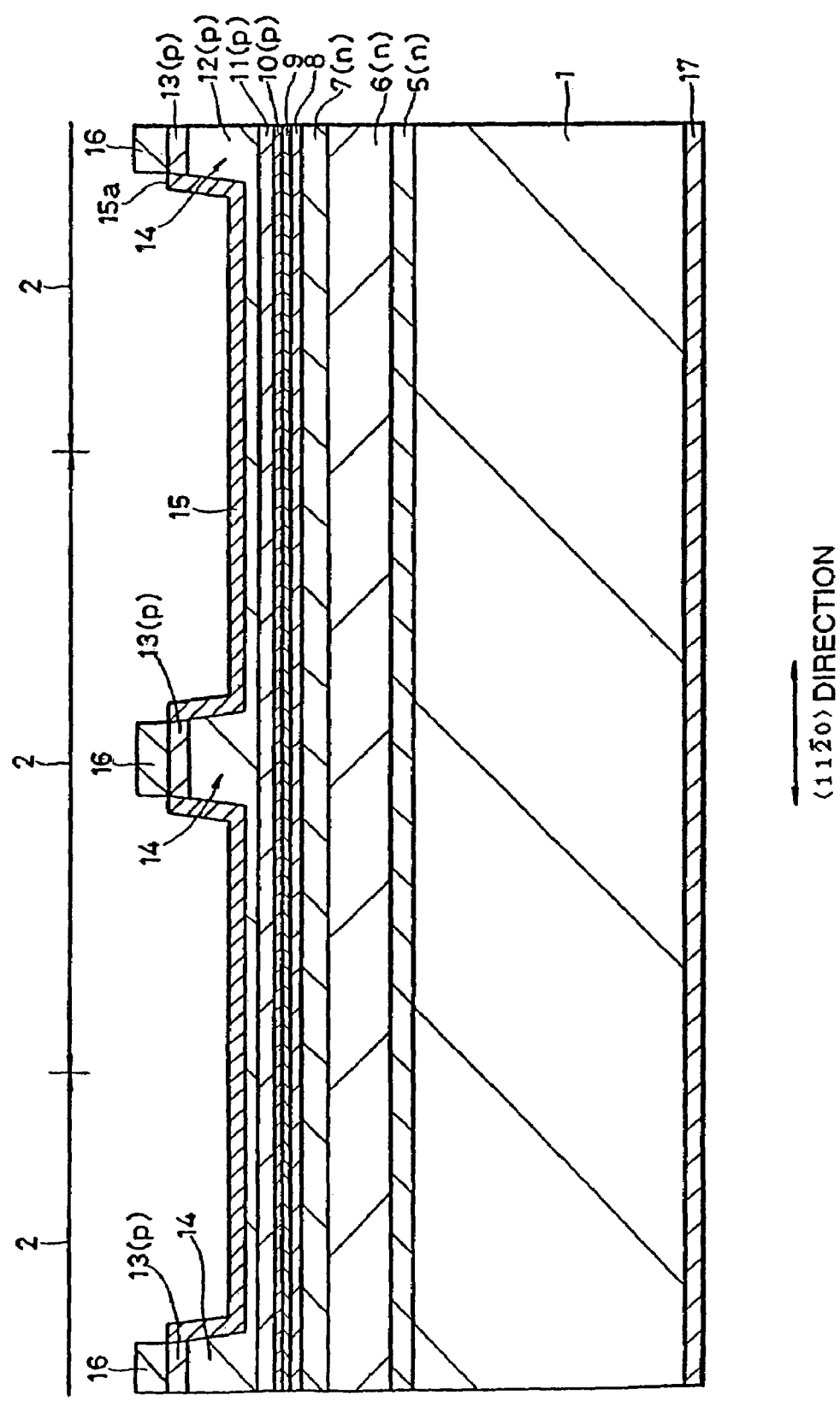
FIG. 10 is a cross-sectional view for explaining the method of manufacturing the GaN compound semiconductor laser according to the first embodiment of the invention.

Next using the $SiO_2$ film as a mask, the underlying layers are selectively etched by RIE, for example, down to a predetermined depth of the p-type AlGaN clad layer 12 to obtain the ridge 14 extending in the <1-100> direction as shown in FIG. 10. The ridge 14 is 3 μm wide, for example. In this RIE, a chlorine-based is be used as the etching gas, for example.

In the next process, after the $SiO_2$ film used as the etching mask is removed, an insulating film 15 such as a 0.3 μm thick $SiO_2$ film, for example, is formed on the entire surface of the substrate by CVD, vacuum evaporation or sputtering, for example. The insulating film 15 serves as an electrical insulator and a surface protector.

In the next process, a resist pattern (not shown) locally covering the insulating film 15 excluding the region for a p-side electrode is formed by lithography.

Thereafter, using this resist pattern as a mask, the insulating film 15 is etched to form an opening 15a.

After that, while maintaining the resist pattern, A Pd film, Pt film and Au film, for example, are sequentially deposited on the entire substrate surface by vapor deposition, for example, and the resist pattern is removed together with the overlying Pd film, Pt film and Au film (lift-off). As a result, the p-side electrode 16 in contact with the p-type GaN contact layer 13 through the opening 15a of the insulating film 15 is obtained. The Pd film, Pt film and Au film composing the p-side electrode 16 are 10 nm, 100 nm and 300 nm thick, respectively, for example. Thereafter, alloying is carried out to bring the p-side electrode 16 into ohmic contact.

In the next process, a Ti film, Pt film and Au film, for example, are sequentially deposited on the bottom surface of the GaN substrate 1 by vacuum evaporation, for example, to form the n-side electrode having a Ti/Pt/Au structure. The Ti film, Pt film and Au film composing the n-side electrode 17 are 10 nm, 50 nm and 100 nm thick, respectively, for example. Thereafter, alloying is carried out to bring the n-side electrode 17 into ohmic contact.

After that, the GaN substrate 1 having formed the laser structures through the foregoing steps is cut into laser bars by dicing it by cleavage along the border lines of the device regions 2 to form opposite cavity edges. Further, after coating these cavity edges, each bar is divided to chips by dicing it by cleavage, or the like.

Figure 11:
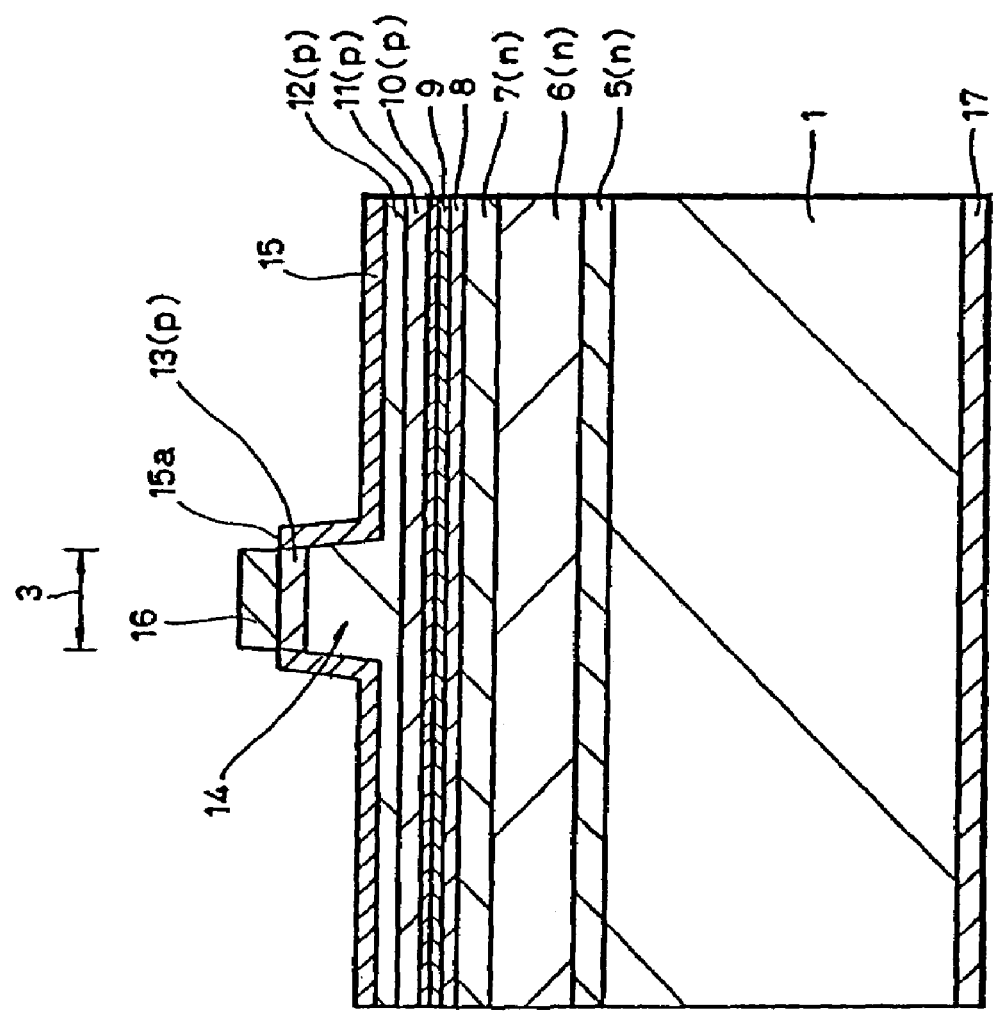
FIG. 11 is a cross-sectional view for explaining the method of manufacturing the GaN compound semiconductor laser according to the first embodiment of the invention.

As a result, the intended GaN compound semiconductor lasers having the ridge structure and the SCH structure are completed as shown in FIG. 11.

As explained above, according to the first embodiment, each device region 2 is defined on the GaN substrate 1 which includes the regions B having a higher average dislocation density and aligned periodically in form of hexagonal lattices in the region A having a lower average dislocation density such that each device region 2 includes substantially no region B, and the GaN compound semiconductor layers, which will form laser structures, are grown on the GaN substrate 1. Therefore, even when some defects, such as dislocations, propagate from the regions B of the GaN compound semiconductor layer 1, the GaN compound semiconductor layers on the device regions 2 can be held free from influences of those defects. After the growth of the GaN compound semiconductor layers, and through further steps of forming the ridge, p-side electrode 16, n-side electrode 17 and others, the GaN substrate 1 having formed the laser structures is divided into discrete GaN compound semiconductor laser chips by dicing it along the border lines of the device regions 2. Therefore, any of the GaN compound semiconductor laser chips include substantially no dislocations taken over from the GaN substrate 1. As a result, GaN compound semiconductor lasers excellent in emission property, enhanced in reliability and elongated in lifetime can be realized.

In addition, in the first embodiment, the undoped InGaN deterioration preventive layer 9 is formed in contact with the active layer 8, and the p-type AlGaN cap layer 10 is formed in contact with the undoped InGaN deterioration preventive layer 9. Therefore, the undoped InGaN deterioration preventive layer 9 greatly alleviates the stress exerted from the p-type AlGaN cap layer 10 to the active layer 8. At the same time, dispersion of Mg used as a p-type dopant of p-type layers into the active layer 7 is prevented effectively.

Next explained is the second embodiment of the invention.

Figure 12:
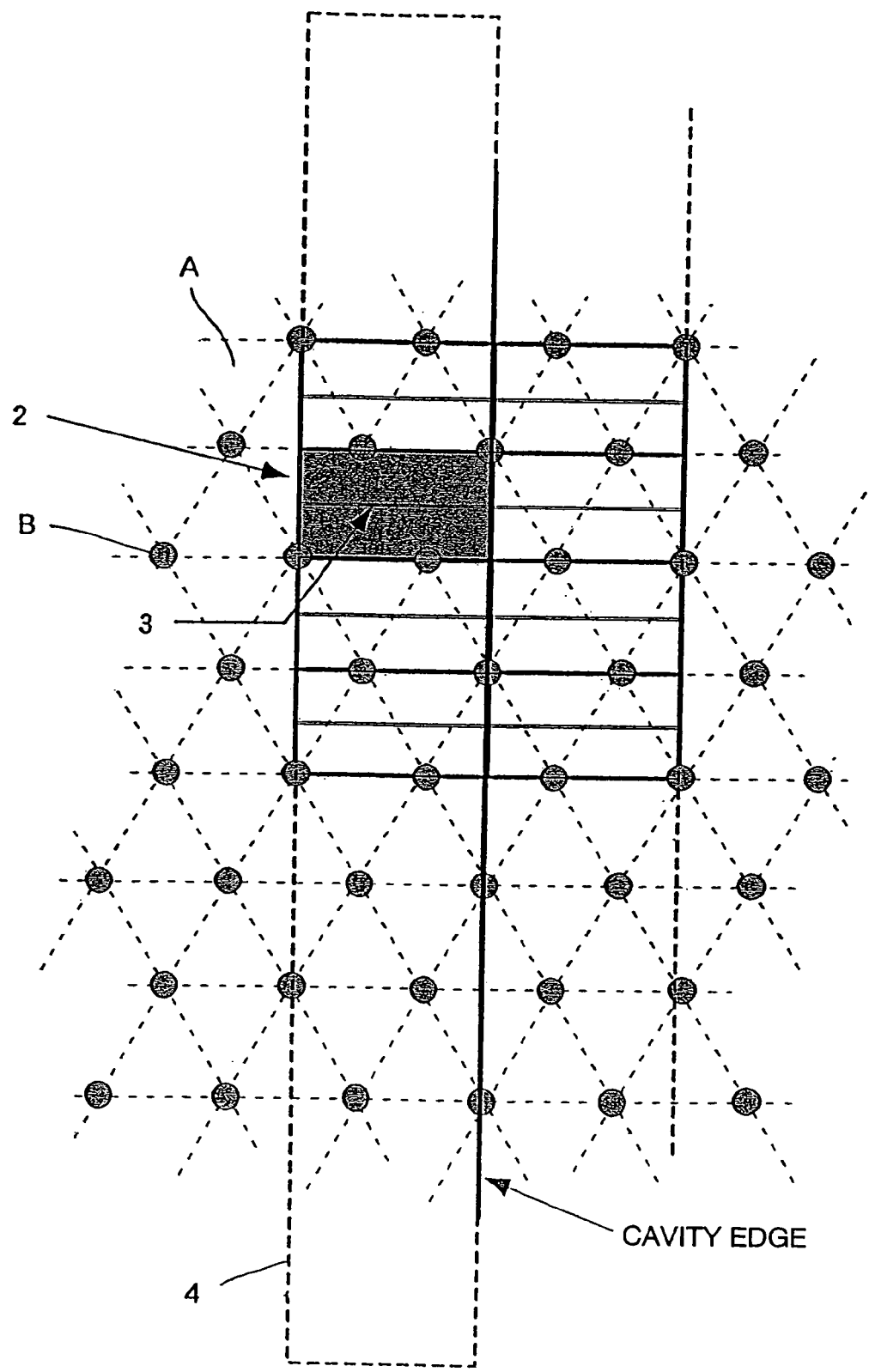
FIG. 12 is a cross-sectional view for explaining a method of manufacturing a GaN compound semiconductor laser according to the second embodiment of the invention.

As shown in FIG. 12, in the second embodiment, both the shorter sides and the longer sides of the rectangular device region 2, which form border lines of each device region 2, are straight lines connecting centers of regions B unlike the first embodiment. Here again, the laser stripes 3 lie on lines connecting midpoints of shorter sides of individual device regions 2. In this manner, transfer of influence of the regions B to the emission regions can be prevented.

The second embodiment is different from the first embodiment in forming cavity mirrors by dicing the substrate by cleavage along the border lines of the device regions 2 that are straight lines connecting centers of regions B.

Figure 13:
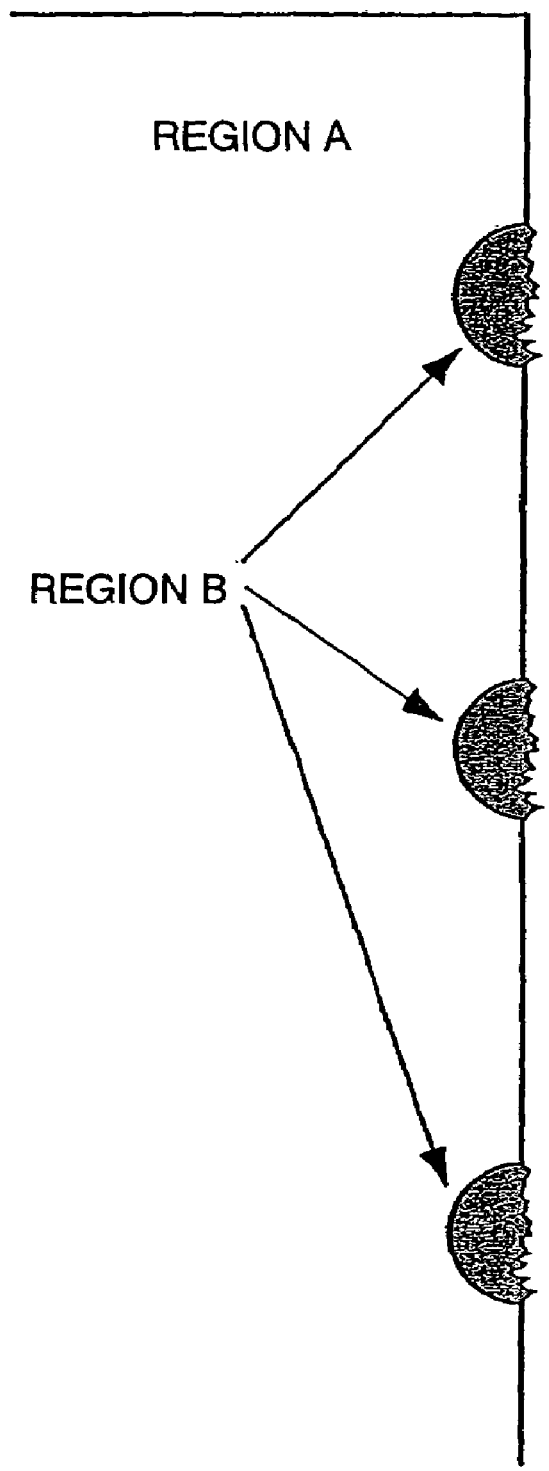
FIG. 13 is a schematic diagram showing an edge of a chip obtained by dicing in the method of manufacturing the GaN compound semiconductor laser according to the second embodiment of the invention.

The regions B having more dislocations are considered easier to break than the region A. Therefore, when the substrate is diced along the straight lines that connect regions B, the regions B function as perforation, and the region A is clearly cleaved, too. In this case, regions B appearing on edges have many dislocations, and will not always become smooth. However, the region A appearing between the regions B on the edges becomes smooth. Such a configuration of an edge is schematically shown in FIG. 13.

It is the end surfaces of the laser stripes 2 that are required to be smooth. Therefore, as far as each device regions is defined in the location relative to the regions B as shown in FIG. 12, regions B appearing on the end surfaces do not adversely affect the emission property.

The other features of the second embodiment are identical to those of the first embodiment. Therefore, their explanation is omitted.

The second embodiment ensures the same advantages as those of the first embodiment.

Next explained is the third embodiment of the invention.

Figure 14:
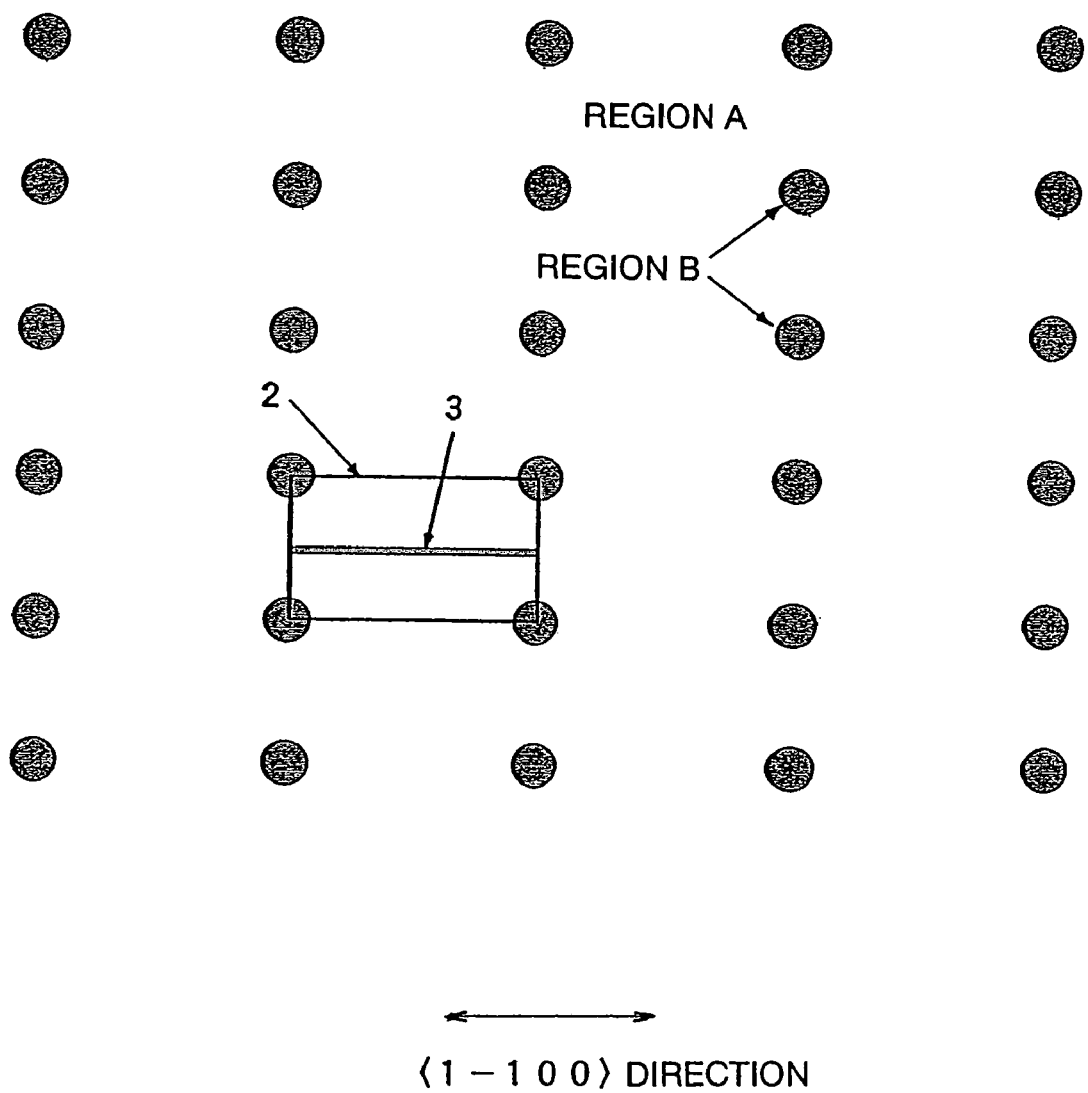
FIG. 14 is a plan view for explaining a method of manufacturing a GaN compound semiconductor laser according to the third embodiment of the invention.

In the third embodiment, as shown in FIG. 14, regions B made of a crystal having a higher average dislocation density are aligned periodically in form of rectangular lattices in the region A having a lower average dislocation density in a GaN substrate 1. A single rectangle having regions B at its four corners is defined as a single device region 2. In this case, each straight line connecting nearest two adjacent regions B in the lengthwise direction of the rectangle coincides with the <1-100> orientation of GaN, and each straight line connecting nearest two adjacent regions B and being one of shorter side of the rectangle coincides with the <11-20> orientation of GaN.

Interval of regions B in the lengthwise direction of the rectangular lattices is 600 µm, for example, and interval of regions B in the direction parallel to the shorter sides of the rectangular lattices is 400 µm, for example. In this case, each device region 2 is sized 600×400 µm.

The laser stripe 3 of each device region 2 lies on the straight line connecting midpoints of opposite shorter sides.

The other features of the third embodiment are identical to those of the first embodiment. Therefore, their explanation is omitted.

The third embodiment also ensures the same advantages as those of the first embodiment.

Next explained is the fourth embodiment of the invention.

Figure 15:
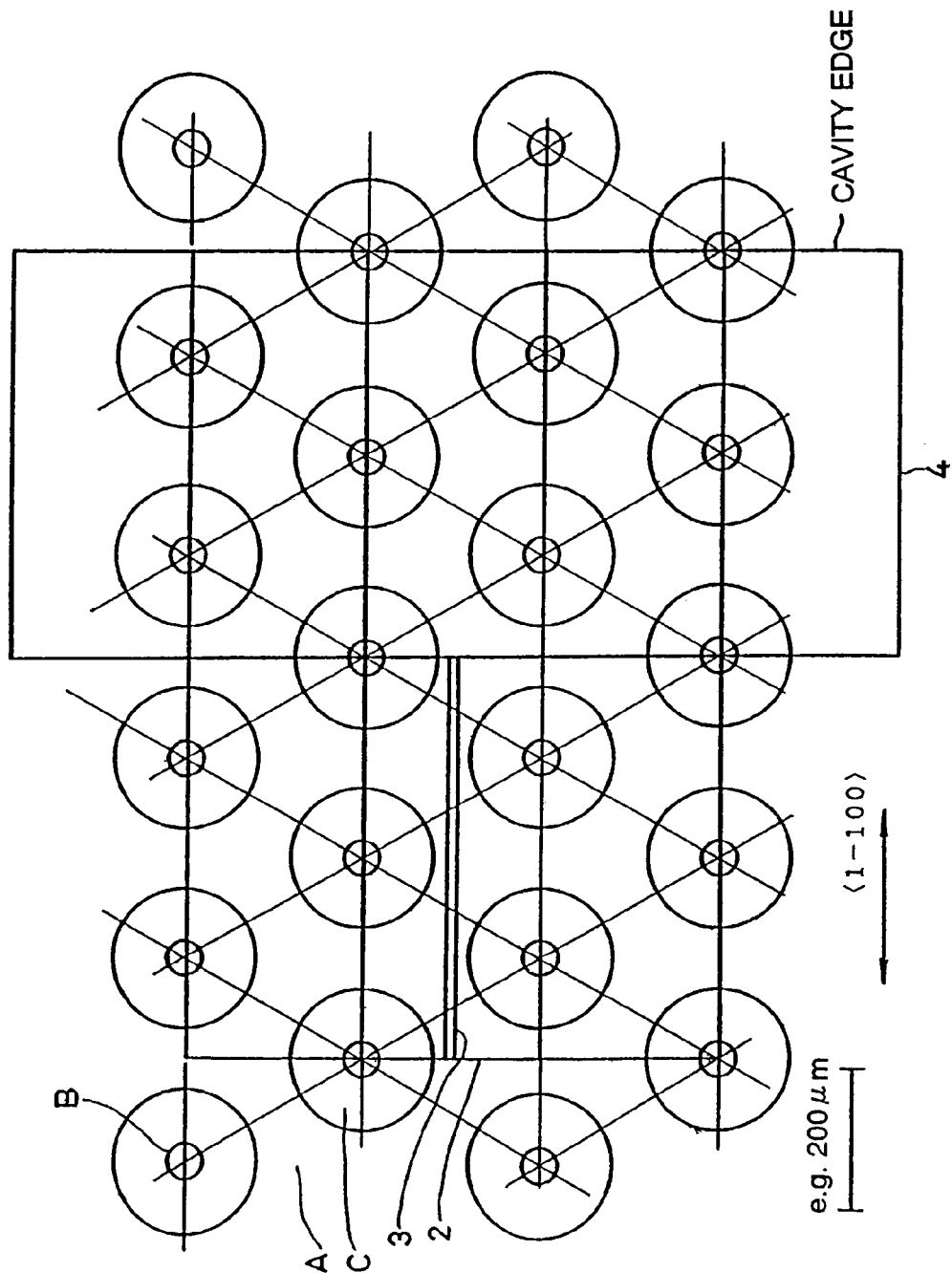
FIG. 15 is a plan view for explaining a method of manufacturing a GaN compound semiconductor laser according to the fourth embodiment of the invention.

In the fourth embodiment, as shown in FIG. 15, regions B are aligned periodically in form of hexagonal lattices in the region A of the GaN substrate 1 similarly to the first embodiment. However, the fourth embodiment is different from the first embodiment in including regions C having an intermediate average dislocation density between the average dislocation density of the region A and the average dislocation density of the regions B and interposed between the region A and individual regions B. More specifically, the average dislocation density of the region A is $2 \times 10^6$ cm$^{-2}$ or more, the average dislocation density of the regions B is $1 \times 10^8$ cm$^{-2}$ or more, and the average dislocation density of the regions C is smaller than $1 \times 10^8$ cm$^{-2}$ and larger than $2 \times 10^6$ cm$^{-2}$. Interval of the regions B (distance between the centers of nearest two adjacent regions B) is 300 µm, for example, diameter of each region B is 20 µm. Diameter of each region C is 120 µm, for example.

In this case, unlike the first embodiment, both the longer sides and the shorter sides of each rectangular device region 2, which define border lines thereof, are straight lines that connect centers of regions B. Each device region is sized 600×260 µm of each rectangular device region 2. Here again, the laser stripes 3 lie on lines connecting midpoints of shorter sides of individual device regions 2. In this embodiment, however, the laser stripes 3 overlap no regions B and no regions C. In this manner, transfer of influence of the regions B and C to the emission regions can be prevented.

The other features of the fourth embodiment are identical to those of the first embodiment. Therefore, their explanation is omitted.

The fourth embodiment also ensures the same advantages as those of the first embodiment.

Next explained is the fifth embodiment of the invention.

Figure 16:
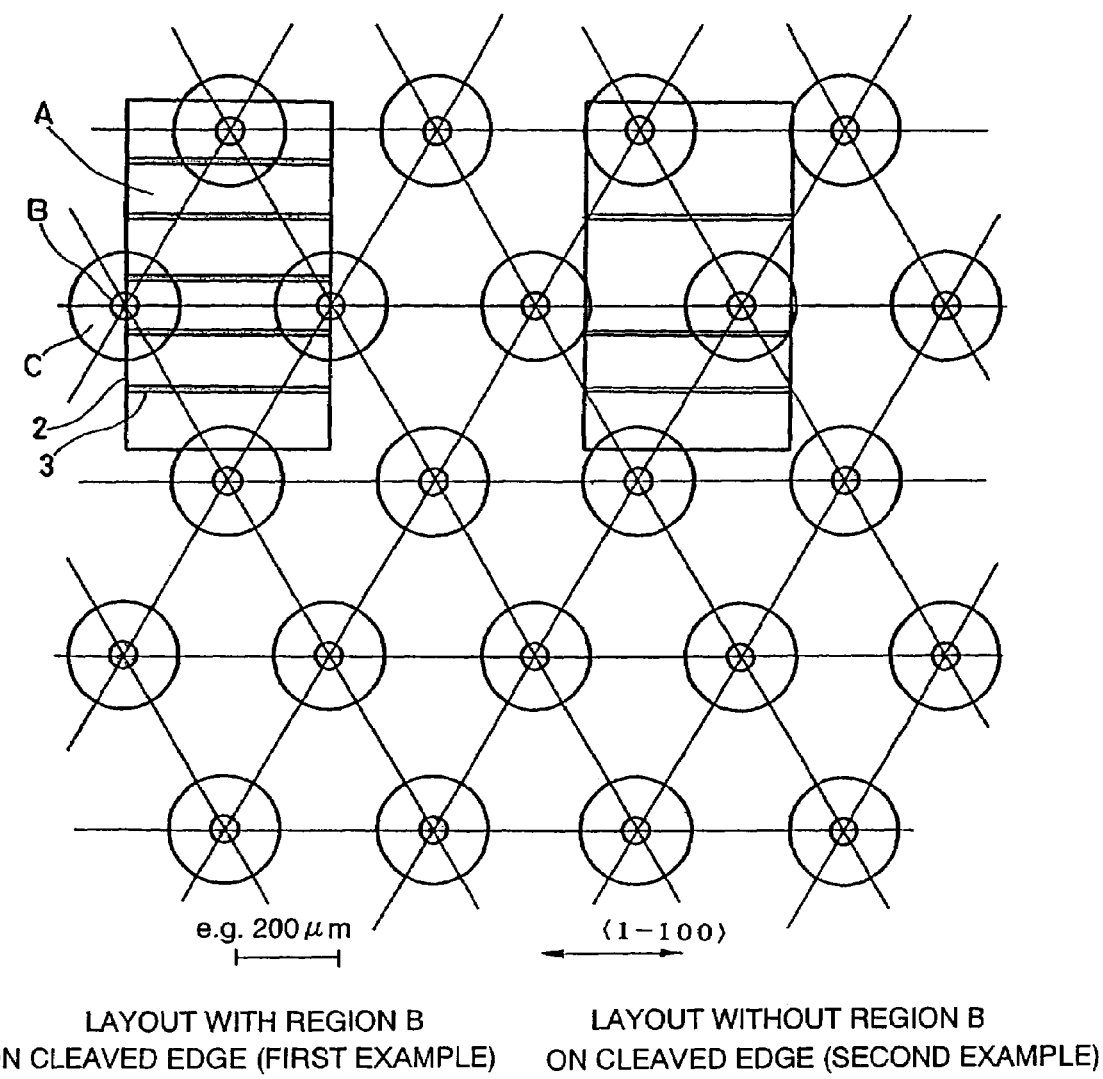
FIG. 16 is a plan view for explaining a method of manufacturing a GaN compound semiconductor laser according to the fifth embodiment of the invention.

In the fifth embodiment, as shown in FIG. 16, regions B are aligned periodically in form of hexagonal lattices in the region A of the GaN substrate 1 similarly to the first embodiment. However, the fifth embodiment is different from the first embodiment in including regions C having an intermediate average dislocation density between the average dislocation density of the region A and the average dislocation density of the regions B and interposed between the region A and individual regions B. More specifically, the average dislocation density of the region A is $2 \times 10^6$ cm$^{-2}$ or more, the average dislocation density of the regions B is $1 \times 10^8$ cm$^{-2}$ or more, and the average dislocation density of the regions C is smaller than $1 \times 10^8$ cm$^{-2}$ and larger than $2 \times 10^6$ cm$^{-2}$. Interval of the regions B (distance between the centers of nearest two adjacent regions B) is 400 µm, for example, diameter of each region B is 20 µm. Diameter of each region C is 120 µm, for example.

In this case, unlike the first embodiment, the device region 2 taken as the first example is defined such that the border lines corresponding to the shorter sides of the rectangular device region 2 are straight lines connecting centers of regions B and the border lines corresponding to the longer sides of the rectangle are straight lines distant by 23 µm from straight lines connecting nearest adjacent two regions B. In this example, the device region 2 is sized 400×300 µm, for example. Here again, the laser stripes 3 lie on lines connecting midpoints of shorter sides of individual device regions 2. In this embodiment, however, the laser stripes 3 overlap no regions B and no regions C. In this manner, transfer of influence of the regions B and C to the emission regions can be prevented.

On the other hand, the device region 2 taken as the second example is defined such that the border lines corresponding to the longer sides of the rectangular device region 2 are distant by 23 µm from straight lines connecting centers of nearest two adjacent regions B in the <1-100> direction, and the border lines corresponding to the shorter sides of the rectangle are distant by 100 µm from straight lines connecting nearest two adjacent regions B in the <11-20> direction. Here again, the device region 2 is sized 400×300 µm, for example, and the laser stripes 3 lie on lines connecting midpoints of shorter sides of individual device regions 2. In this embodiment, however, the laser stripes 3 overlap no regions B and no regions C. In this manner, transfer of influence of the regions B and C to the emission regions can be prevented.

The other features of the fifth embodiment are identical to those of the first embodiment. Therefore, their explanation is omitted.

The fifth embodiment also ensures the same advantages as those of the first embodiment.

Next explained is the sixth embodiment of the invention.

Figure 17:
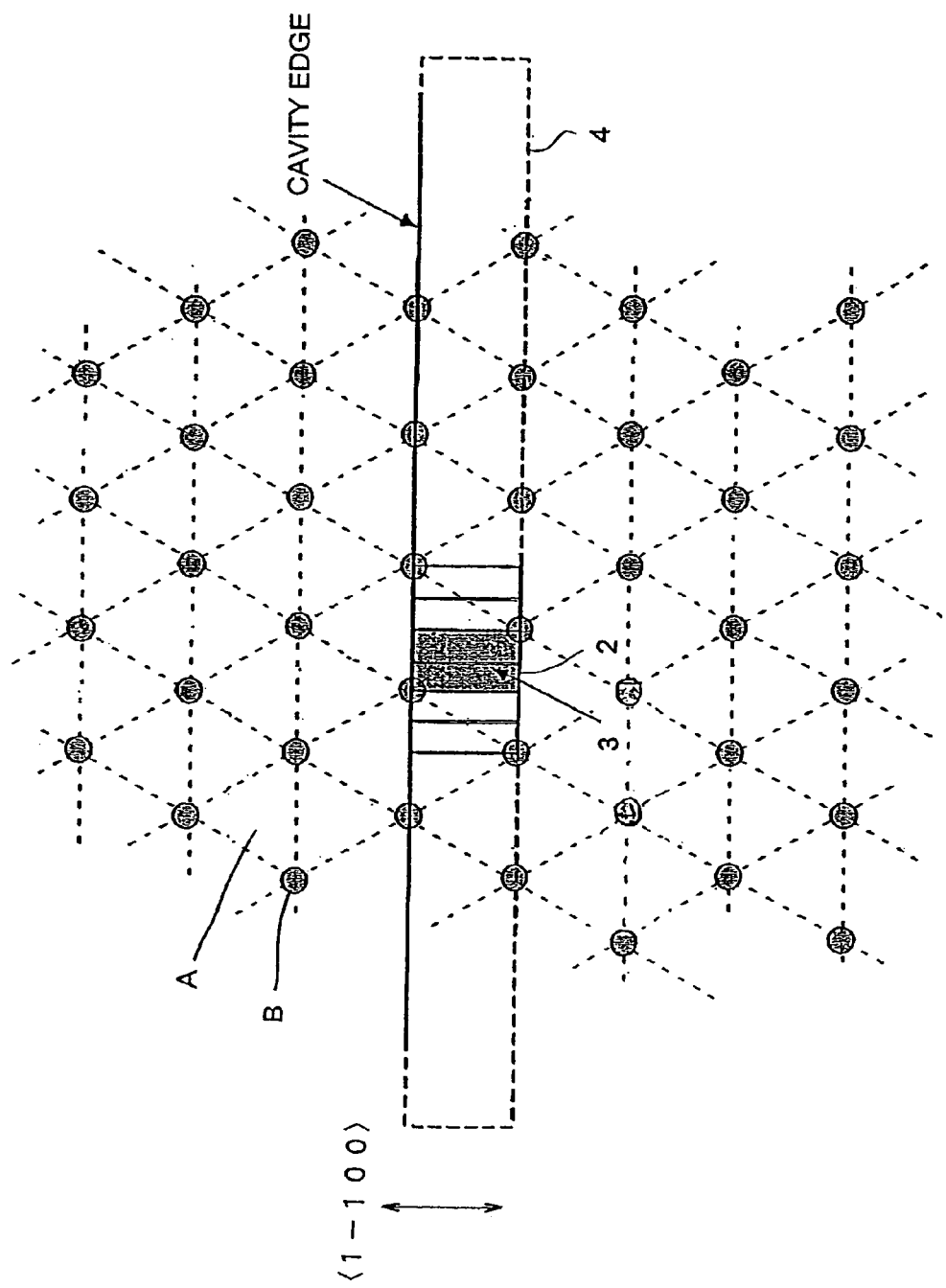
FIG. 17 is a plan view for explaining a method of manufacturing a GaN compound semiconductor laser according to the sixth embodiment of the invention.

In the sixth embodiment, as shown in FIG. 17, regions B are aligned periodically in form of hexagonal lattices in the region A of the GaN substrate 1 similarly to the first embodiment. However, the sixth embodiment is different from the first embodiment in that the span between centers of closest adjacent regions B in the <1-100> direction is two times the length of a shorter side of each rectangular device region 2, i.e. 700 μm, for example. Border lines defining shorter sides of each device region 2 lie on straight lines each connecting closest adjacent regions B in the <11-20> direction whereas border lines defining the longer sides lie on straight lines each connecting closest adjacent regions B in the <1-100> direction. In this case, each device region 2 is sized 606×350 μm, for example. The laser stripes 3 lie on lines connecting midpoints of shorter sides of individual device regions 2, do not overlap any of the regions B. In this manner, transfer of influence of the regions B to the emission regions can be prevented.

The other features of the sixth embodiment are identical to those of the first embodiment. Therefore, their explanation is omitted.

The sixth embodiment also ensures the same advantages as those of the first embodiment.

Next explained is the seventh embodiment of the invention.

Figure 18:
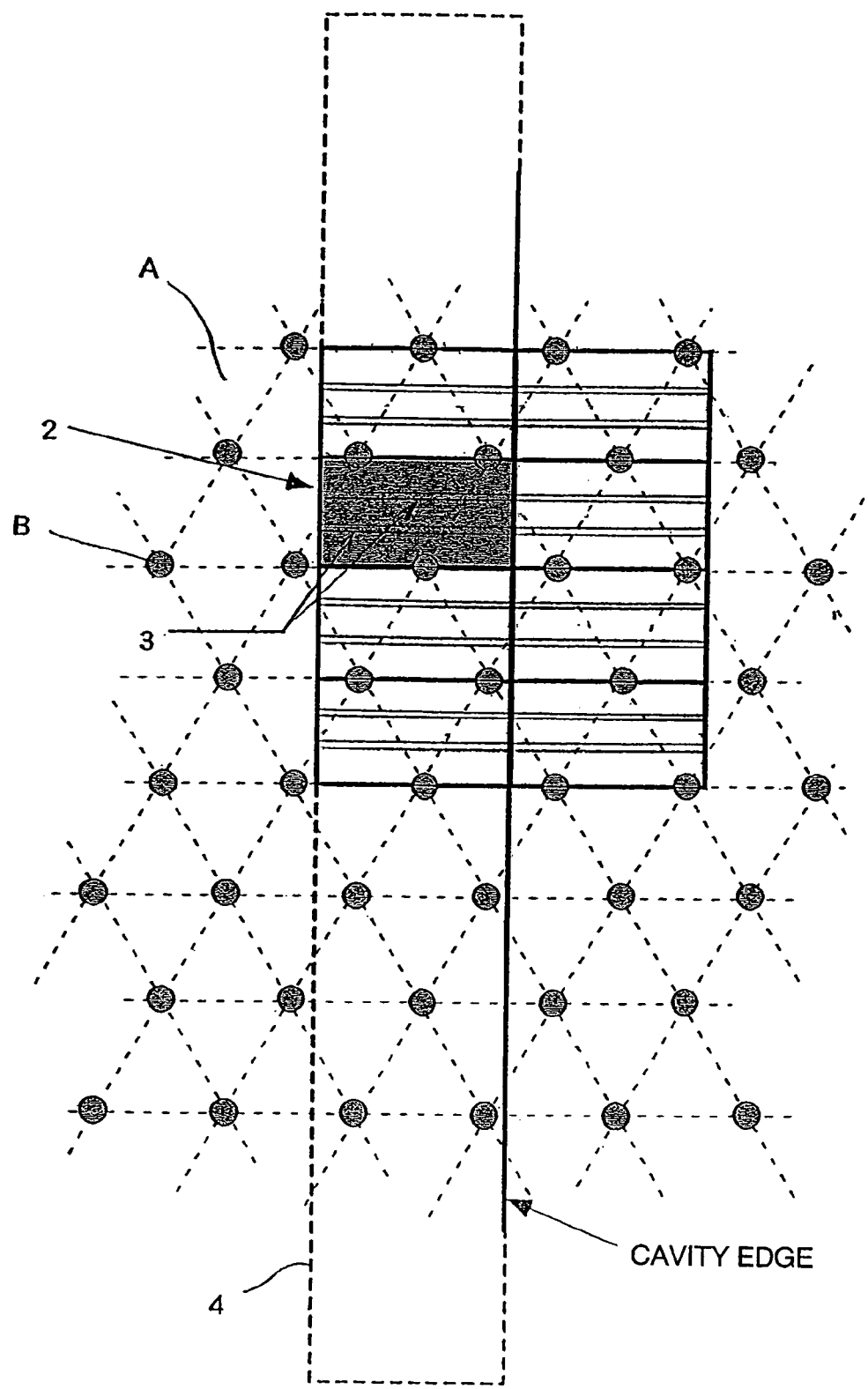
FIG. 18 is a plan view for explaining a method of manufacturing a GaN compound semiconductor laser according to the seventh embodiment of the invention.
Figure 19:
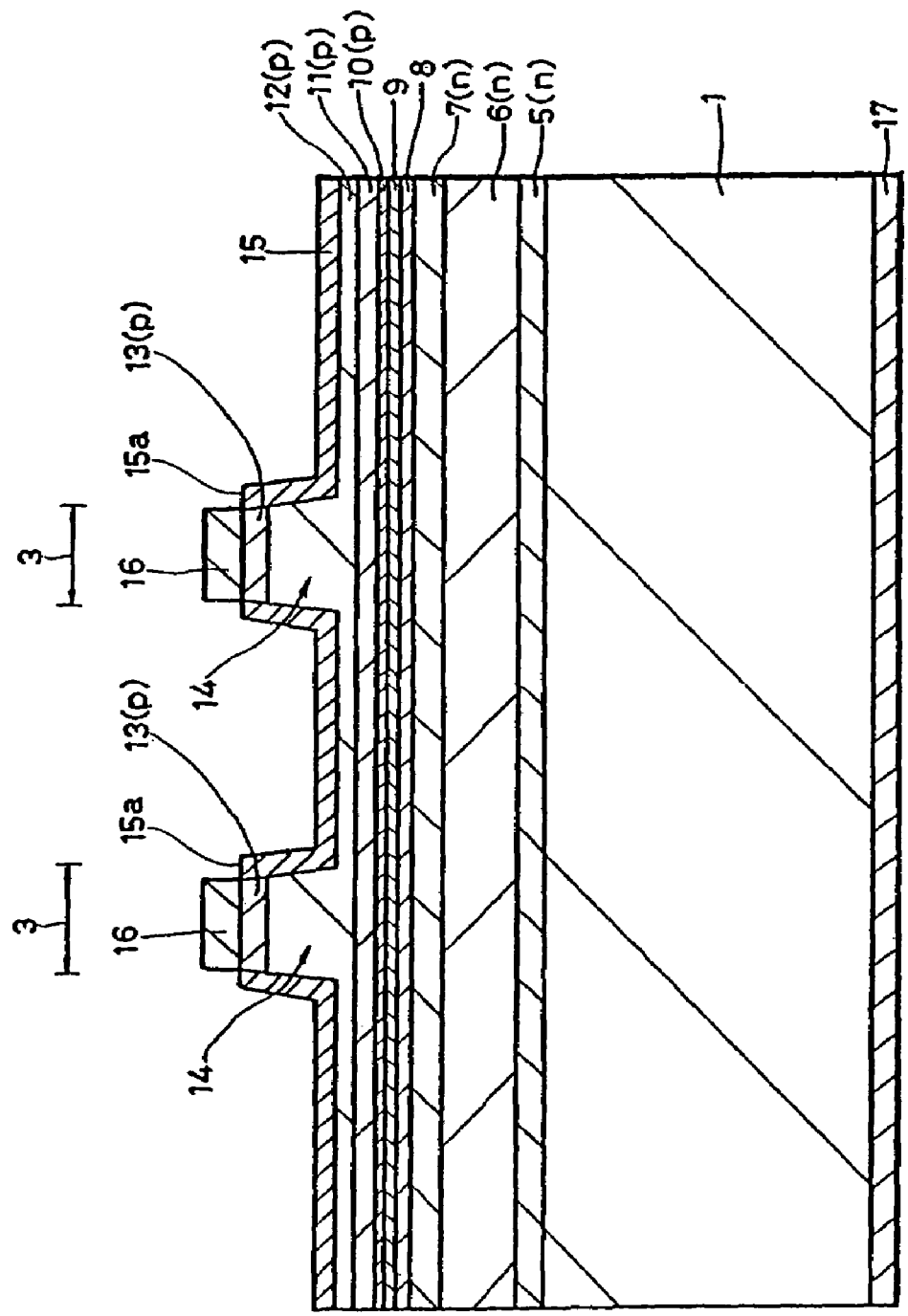
FIG. 19 is a cross-sectional view showing the GaN compound semiconductor laser manufactured by the method according to seventh embodiment of the invention.

In the seventh embodiment, as shown in FIG. 18, two laser stripes 3 are formed in each device region 2 in parallel to each other. FIG. 19 shows a GaN compound semiconductor laser chip obtained by dicing along border lines of device regions 2.

The other features of the seventh embodiment are identical to those of the first embodiment. Therefore, their explanation is omitted.

The seventh embodiment also ensures the same advantages as those of the first embodiment in a multi-beam GaN compound semiconductor laser.

Next explained is the eighth embodiment of the invention.

Figure 20:
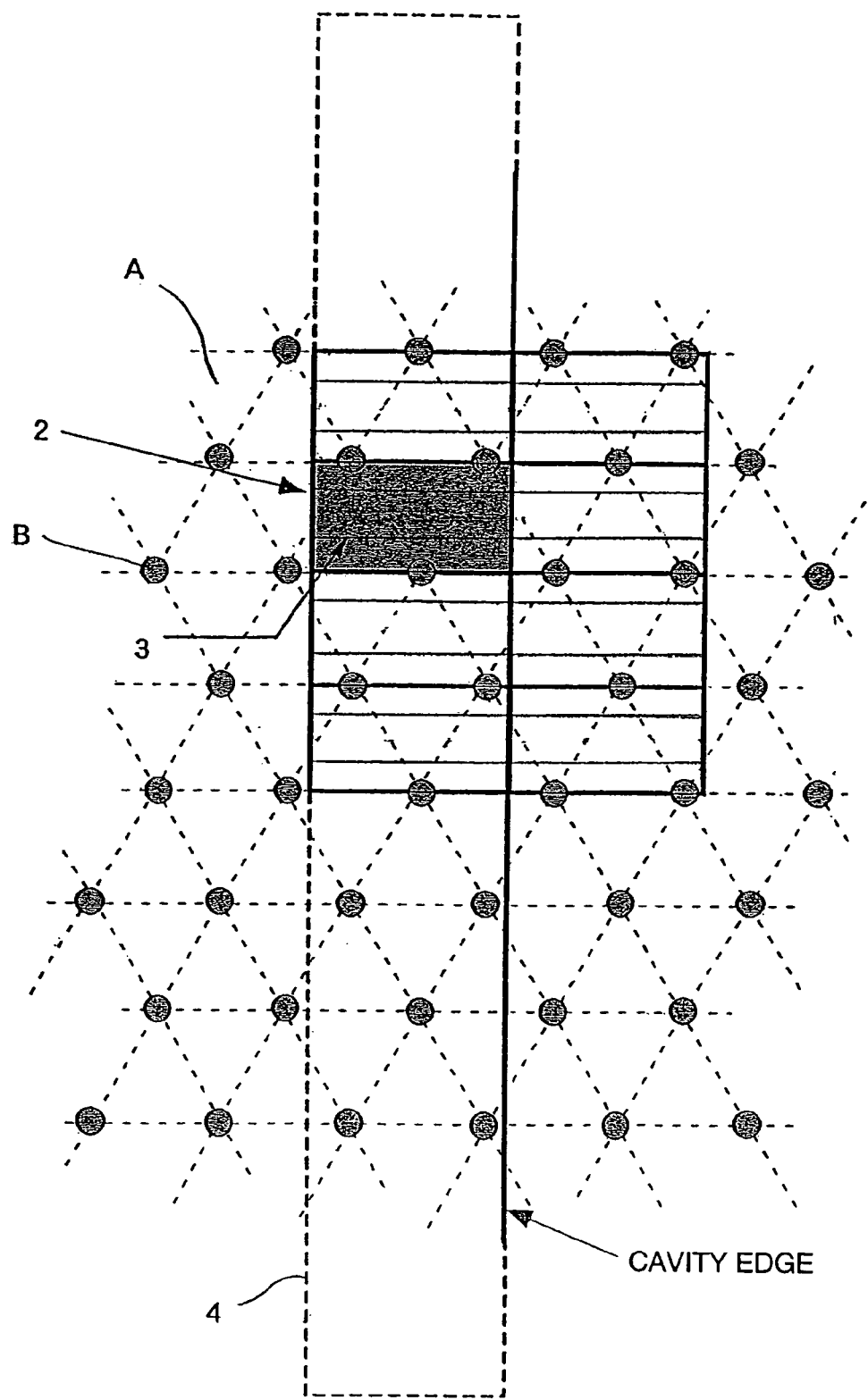
FIG. 20 is a plan view for explaining a method of manufacturing a GaN compound semiconductor laser according to the eighth embodiment of the invention.
Figure 21:
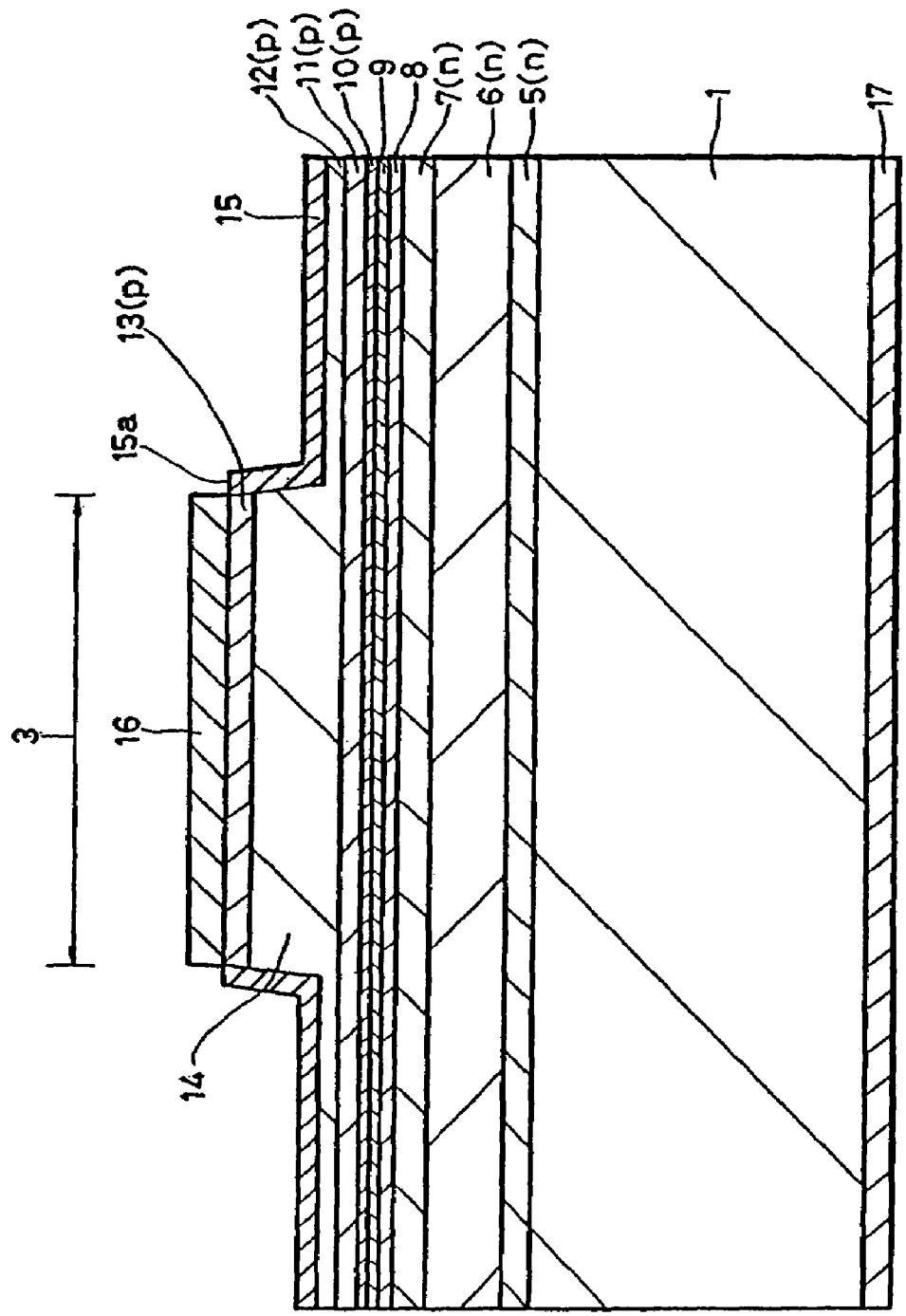
FIG. 21 is a cross-sectional view showing the GaN semiconductor laser manufactured by the method according to eighth embodiment of the invention.

In the eighth embodiment, as shown in FIG. 20, a laser stripe 3 is formed in each device region similarly to the first embodiment. In this embodiment, however, the laser stripe 3 is much wider than that of the first embodiment. More specifically, when the length of the shorter side of each rectangular device region 2 is a and the diameter of each region B is d, the maximum width of each laser stripe 3 will be a–d. However, the laser stripe 3 had better be apart from regions B by at least 1 μm. Taking it into account, the practical maximum width of the laser stripe 3 will be a–d–2 μm. For example, in case of a=346 μm and d=20 μm, the upper limit of the width of the laser stripe 3 is 346–20–2=324 μm. In a preferable example, the laser stripe 3 may be 200 μm wide. FIG. 21 shows a GaN compound semiconductor laser chip obtained by dicing along borderlines of device regions 2 in that example.

The other features of the eighth embodiment are identical to those of the first embodiment. Therefore, their explanation is omitted.

The eighth embodiment also ensures the same advantages as those of the first embodiment.

Next explained is the ninth embodiment of the invention.

Figure 22:
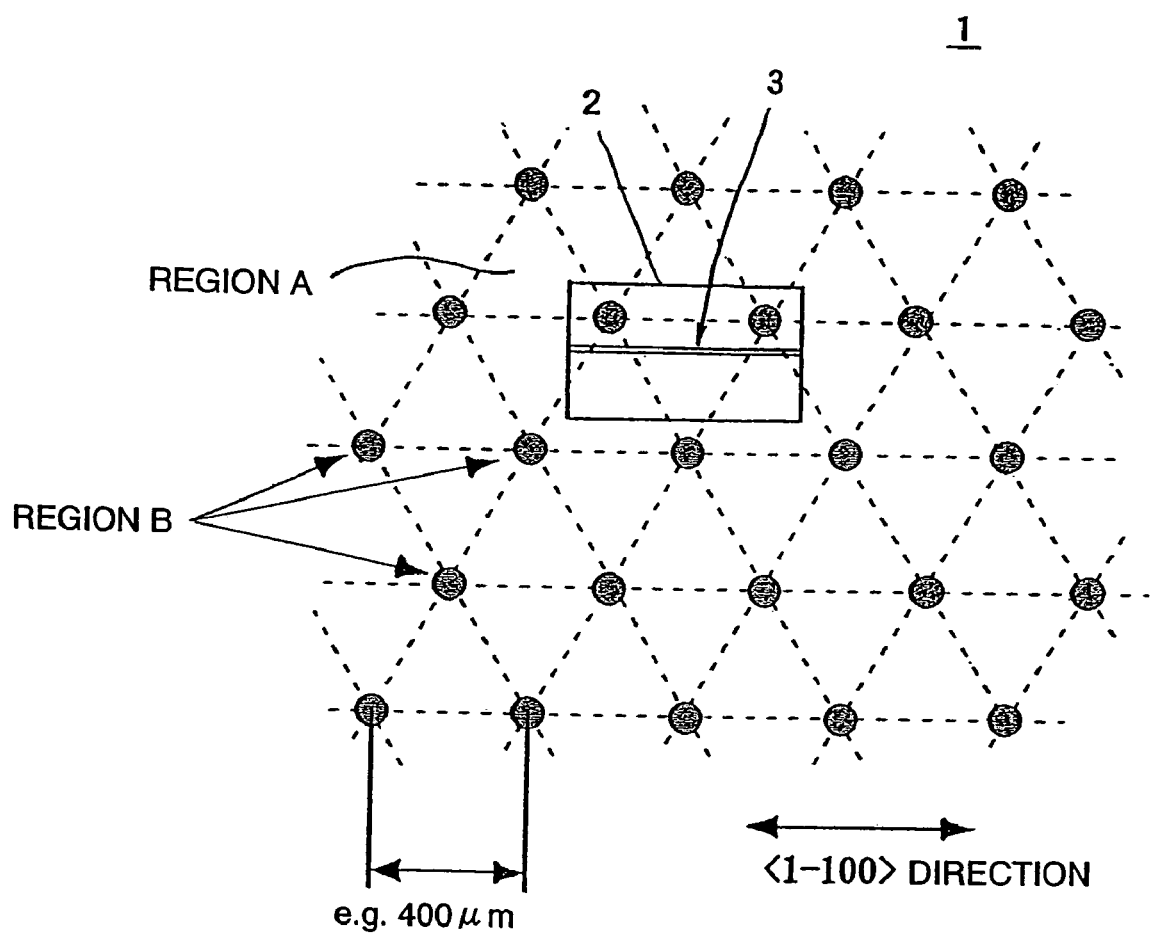
FIG. 22 is a plan view for explaining a method of manufacturing a GaN compound semiconductor laser according to the ninth embodiment of the invention.

FIG. 22 is a plan view showing a GaN substrate used in the ninth embodiment.

In the ninth embodiment, as shown in FIG. 22, device regions B are defined not include regions B in laser stripes 3. The laser stripes 3 are distant from regions B by at least 50 μm. In this case, the device 2 illustrated here results in overlapping two regions B.

The other features of the ninth embodiment are identical to those of the first embodiment. Therefore, their explanation is omitted.

The ninth embodiment also ensures the same advantages as those of the first embodiment.

Next explained is the tenth embodiment of the invention.

Figure 23:
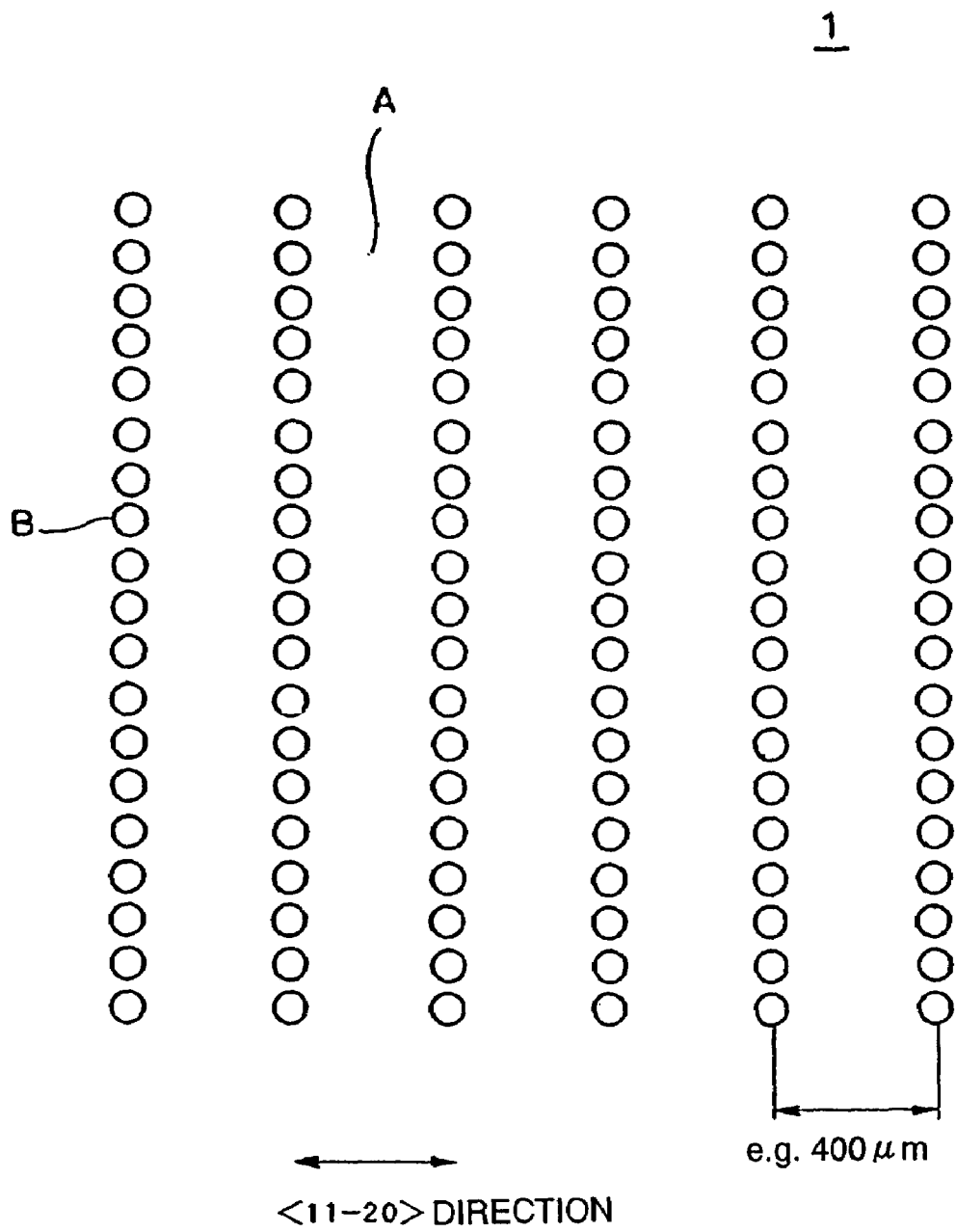
FIG. 23 is a plan view for explaining a method of manufacturing a GaN compound semiconductor laser according to the tenth embodiment of the invention.
Figure 24:
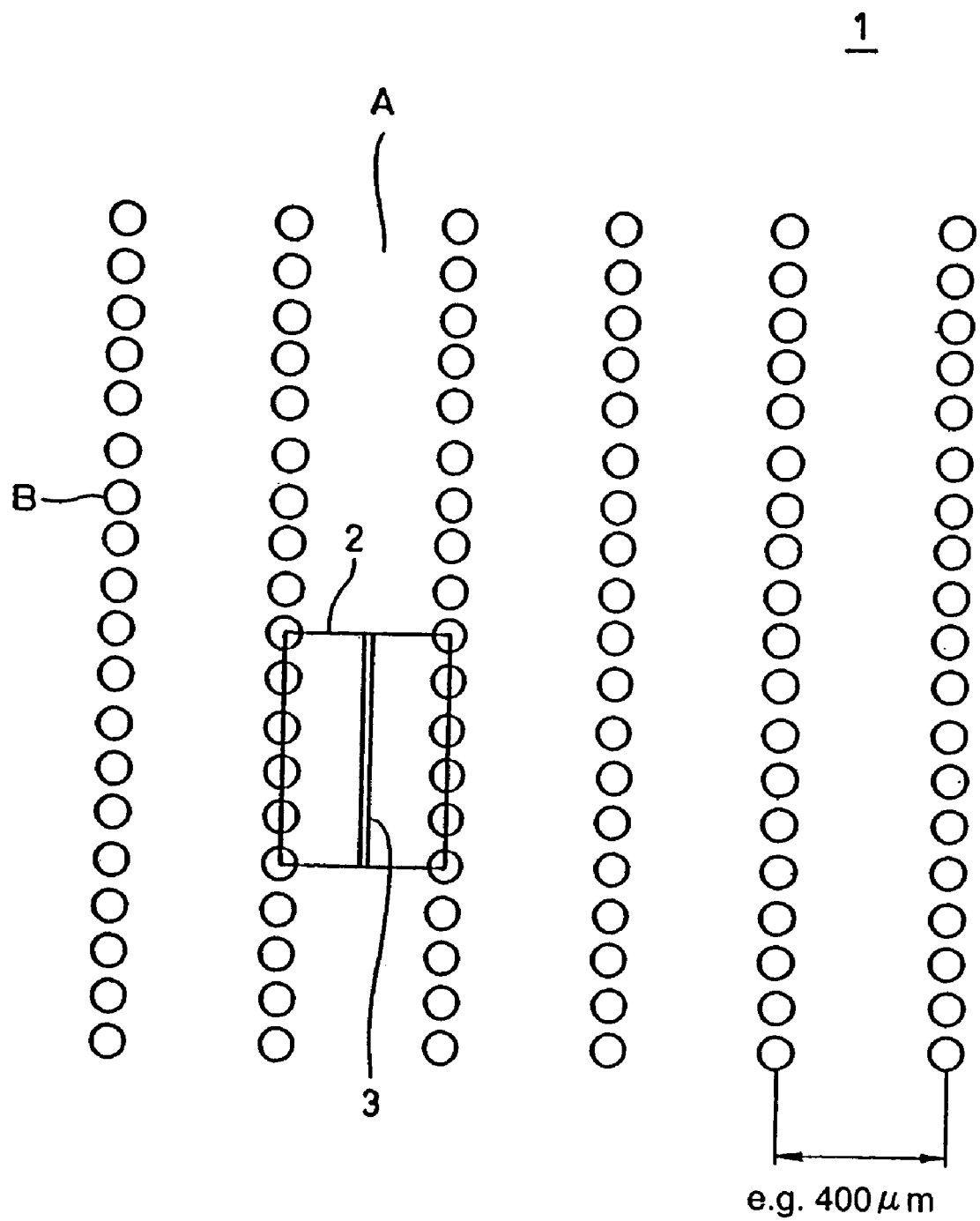
FIG. 24 is a plan view for explaining a method of manufacturing a GaN compound semiconductor laser according to the tenth embodiment of the invention.

FIG. 23 is a plan view showing a GaN substrate used in the tenth embodiment. This GaN substrate 1 is an n-type substrate having the C-plane orientation. The GaN substrate, however, may have the R-plane, A-plane or M-plane orientation, alternatively. In this GaN substrate 1, regions B composed of a crystal having a higher average dislocation density are aligned in the region A composed of a crystal having a lower average dislocation density in periodical intervals of 400 μm, for example, in the <11-20> direction and in periodical intervals of 20~100 μm, for example in the <1-100> direction normal to the <11-20> direction. The <11-20> and <1-100> directions may be vice versa.

In the tenth embodiment, device regions 2 are defined such that a pair of end surfaces parallel to the laser stripes 3 lie on neighboring rows of regions B in the <1-100> direction, respectively, and the laser stripe 3 lies near the center of the region between those rows of the regions B. In this case, any of the device regions 2 does not substantially include any row of regions B.

The other features of the tenth embodiment are identical to those of the first embodiment. Therefore, their explanation is omitted.

The tenth embodiment also ensures the same advantages as those of the first embodiment.

Next explained is the eleventh embodiment of the invention.

Figure 25:
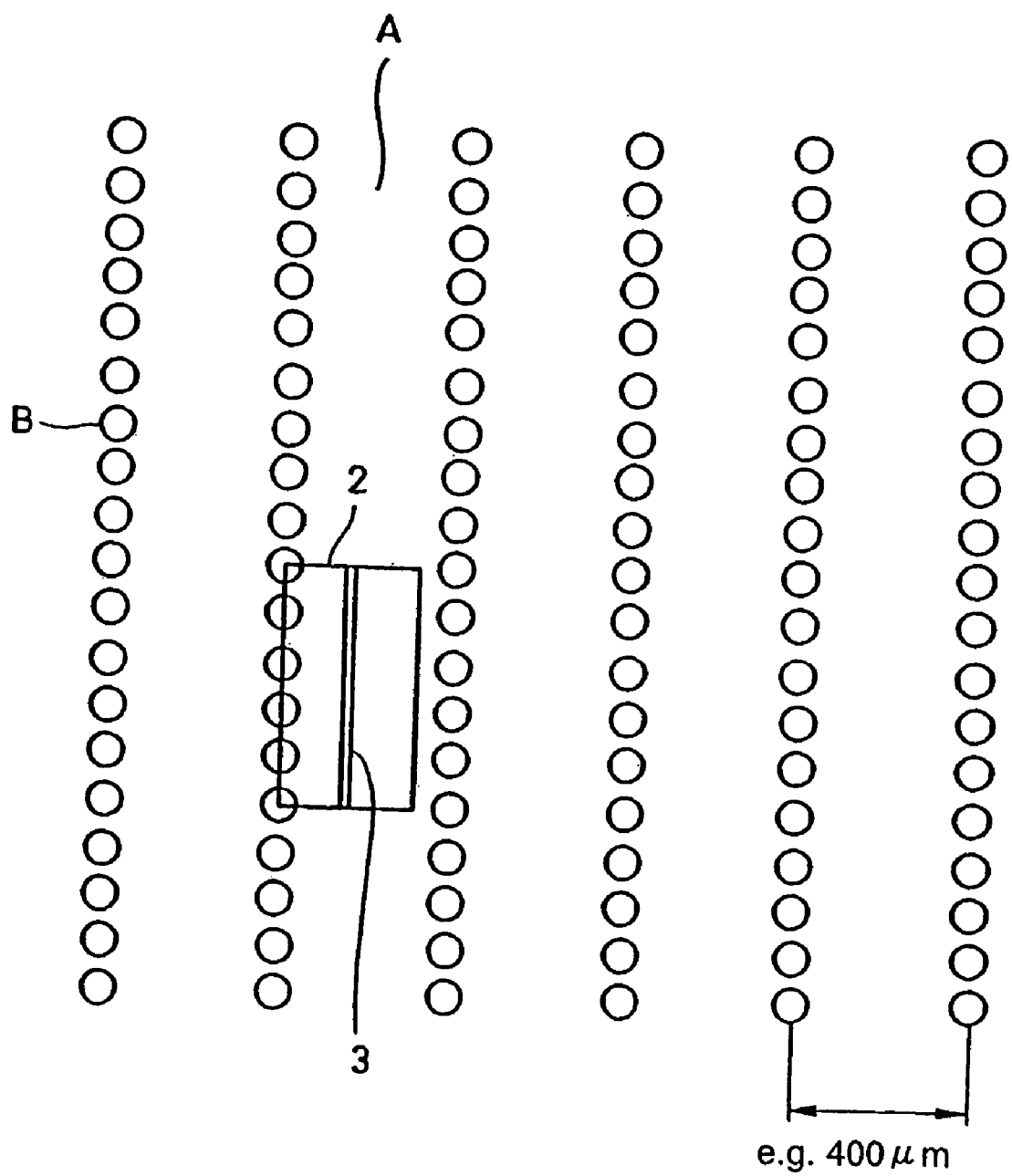
FIG. 25 is a plan view for explaining a method of manufacturing a GaN compound semiconductor laser according to the eleventh embodiment of the invention.

As shown in FIG. 25, the eleventh embodiment uses a GaN substrate 1 similar to that of the tenth embodiment. However, it is different from the tenth embodiment in that one end surface parallel to each laser stripe lies on a row of regions B in the <1-100> direction but the opposite end surface extend along a line distant from a next row of regions B. Here again, any of the device regions 2 does not substantially include any row of regions B.

The other features of the eleventh embodiment are identical to those of the tenth and first embodiments. Therefore, their explanation is omitted.

The eleventh embodiment also ensures the same advantages as those of the first embodiment.

Next explained is the twelfth embodiment of the invention.

Figure 26:
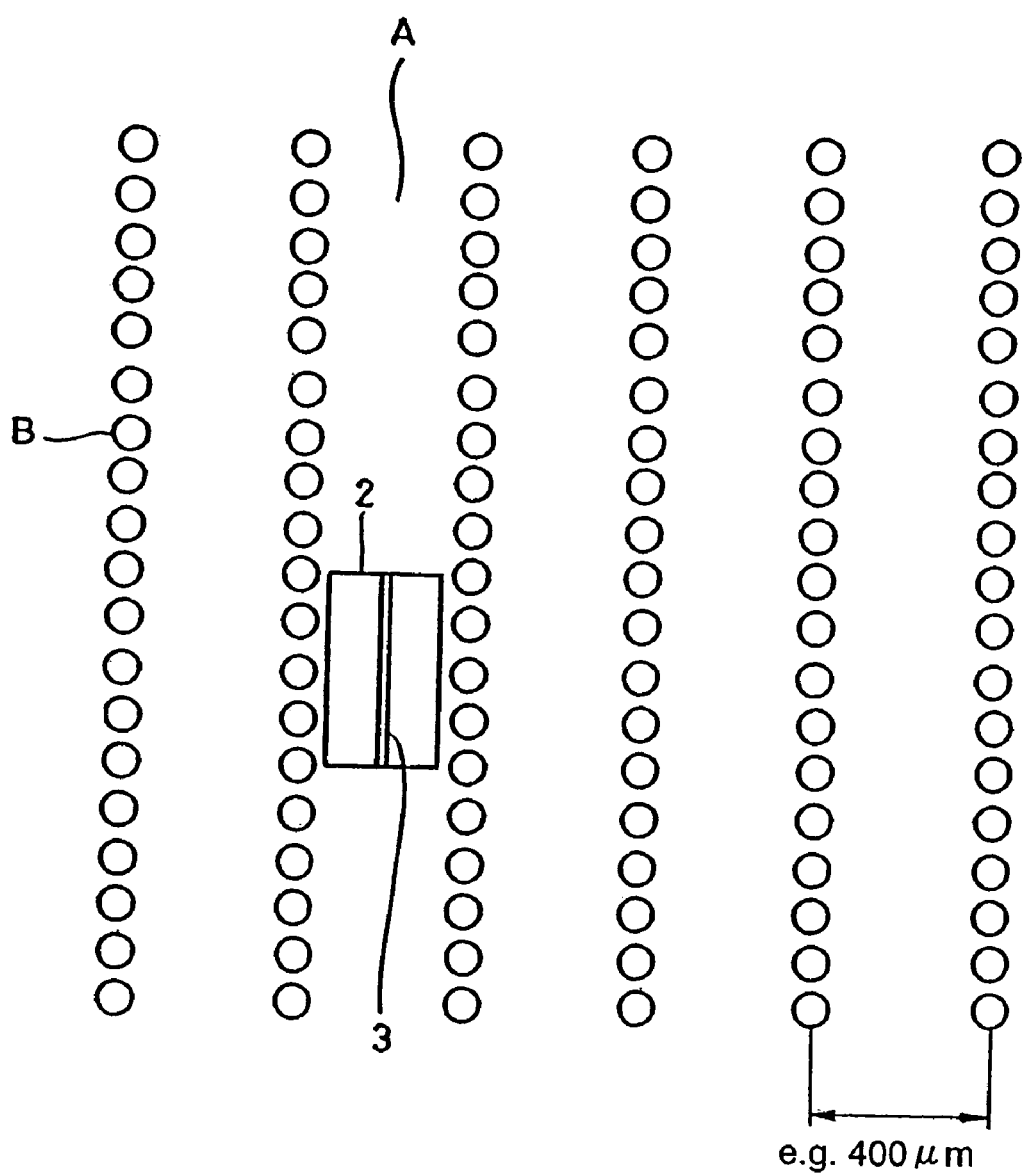
FIG. 26 is a plan view for explaining a method of manufacturing a GaN compound semiconductor laser according to the twelfth embodiment of the invention.

As shown in FIG. 26, the twelfth embodiment uses a GaN substrate 1 similar to that of the tenth embodiment. However, it is different from the tenth embodiment in that the device regions 2 are defined such that both of opposite end surfaces parallel to the laser stripe 3 reside between neighboring rows of regions B in the <1-100> direction and the laser stripe 3 resides near the center in the area between those rows of regions B. Here again, any of the device regions 2 does not substantially include any row of regions B.

The other features of the twelfth embodiment are identical to those of the tenth and first embodiments.

The twelfth embodiment also ensures the same advantages as those of the first embodiment. Therefore, their explanation is omitted.

Next explained is the thirteenth embodiment of the invention.

Figure 27:
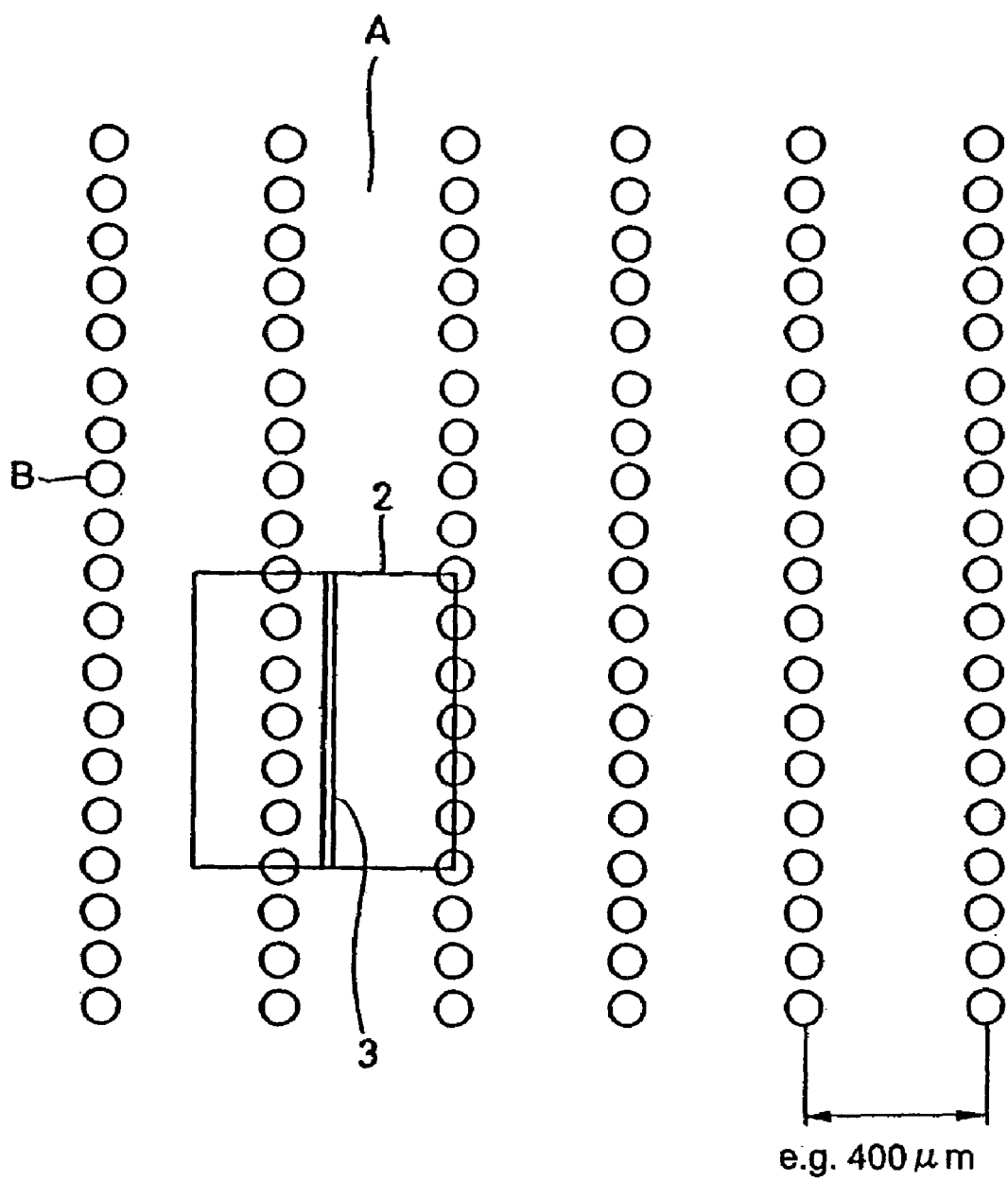
FIG. 27 is a plan view for explaining a method of manufacturing a GaN compound semiconductor laser according to the thirteenth embodiment of the invention.

As shown in FIG. 27, the thirteenth embodiment uses a GaN substrate 1 similar to that of the tenth embodiment. However, it is different from the tenth embodiment in that one of pair of end surfaces parallel to the laser stripe 3 lies on a row of regions B in the <1-100> direction whereas the other end surface resides between next two rows of regions B and the laser stripe 3 extends along a line distant from the nearest row of regions B by 50 μm or more. In this case, each device region 2 includes one row of regions B.

The other features of the thirteenth embodiment are identical to those of the tenth and first embodiments. Therefore, their explanation is omitted.

The thirteenth embodiment also ensures the same advantages as those of the first embodiment.

Next explained is the fourteenth embodiment of the invention.

Figure 28:
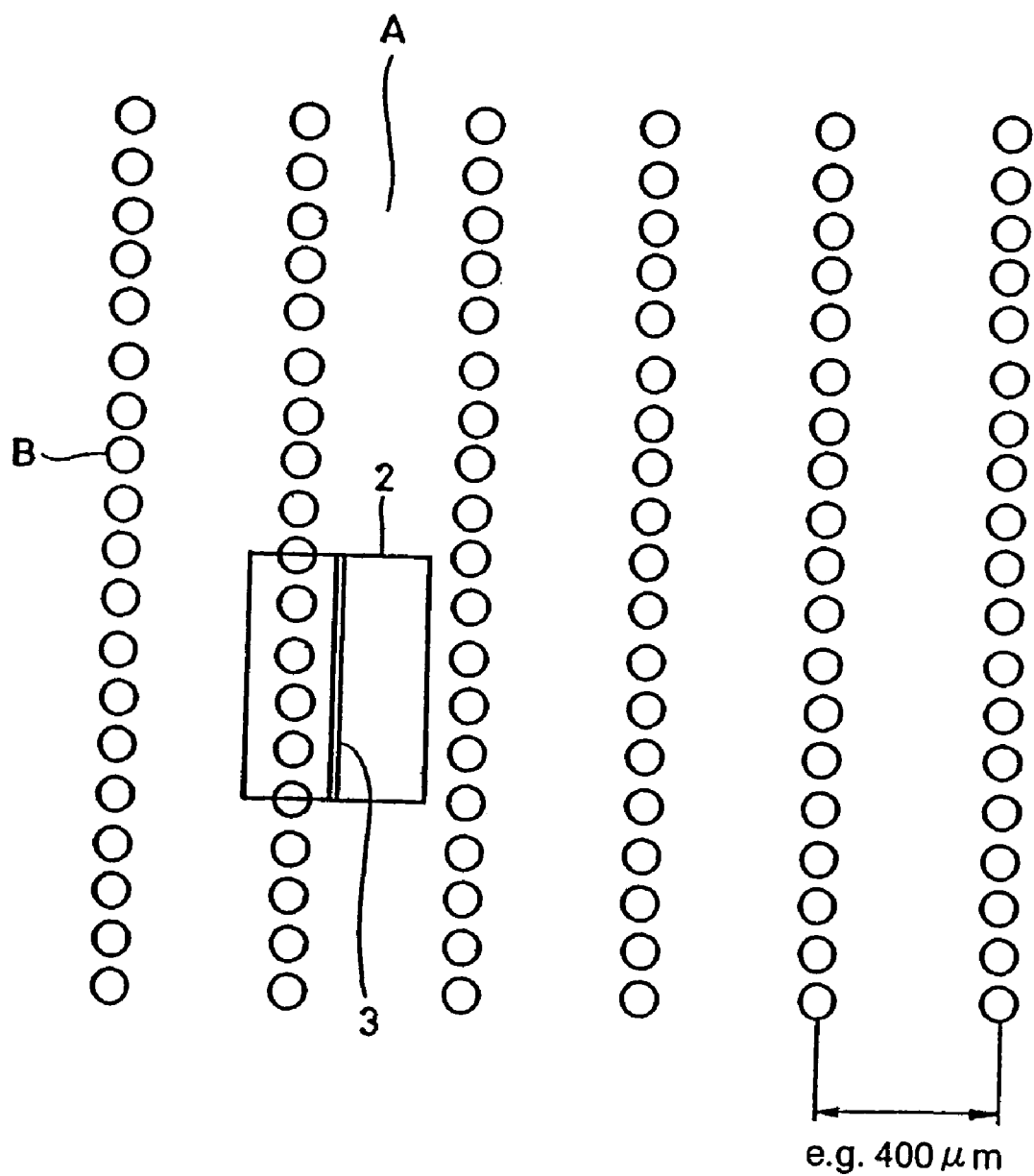
FIG. 28 is a plan view for explaining a method of manufacturing a GaN compound semiconductor laser according to the fourteenth embodiment of the invention.

As shown in FIG. 28, the fourteenth embodiment uses a GaN substrate 1 similar to that of the tenth embodiment. However, it is different from the tenth embodiment in that one of end surfaces parallel to the laser stripe 3 extends along a line distant from a row of regions B in the <1-100> direction whereas the other end surface extends between next two rows of regions B, and that the laser stripe 3 extends along a line distant from the nearest row of regions B by 50 μm or more. In this case, each device region 2 includes one row of regions B.

The other features of the fourteenth embodiment are identical to those of the tenth and first embodiments. Therefore, their explanation is omitted.

The fourteenth embodiment also ensures the same advantages as those of the first embodiment.

Next explained is the fifteenth embodiment of the invention.

Figure 29:
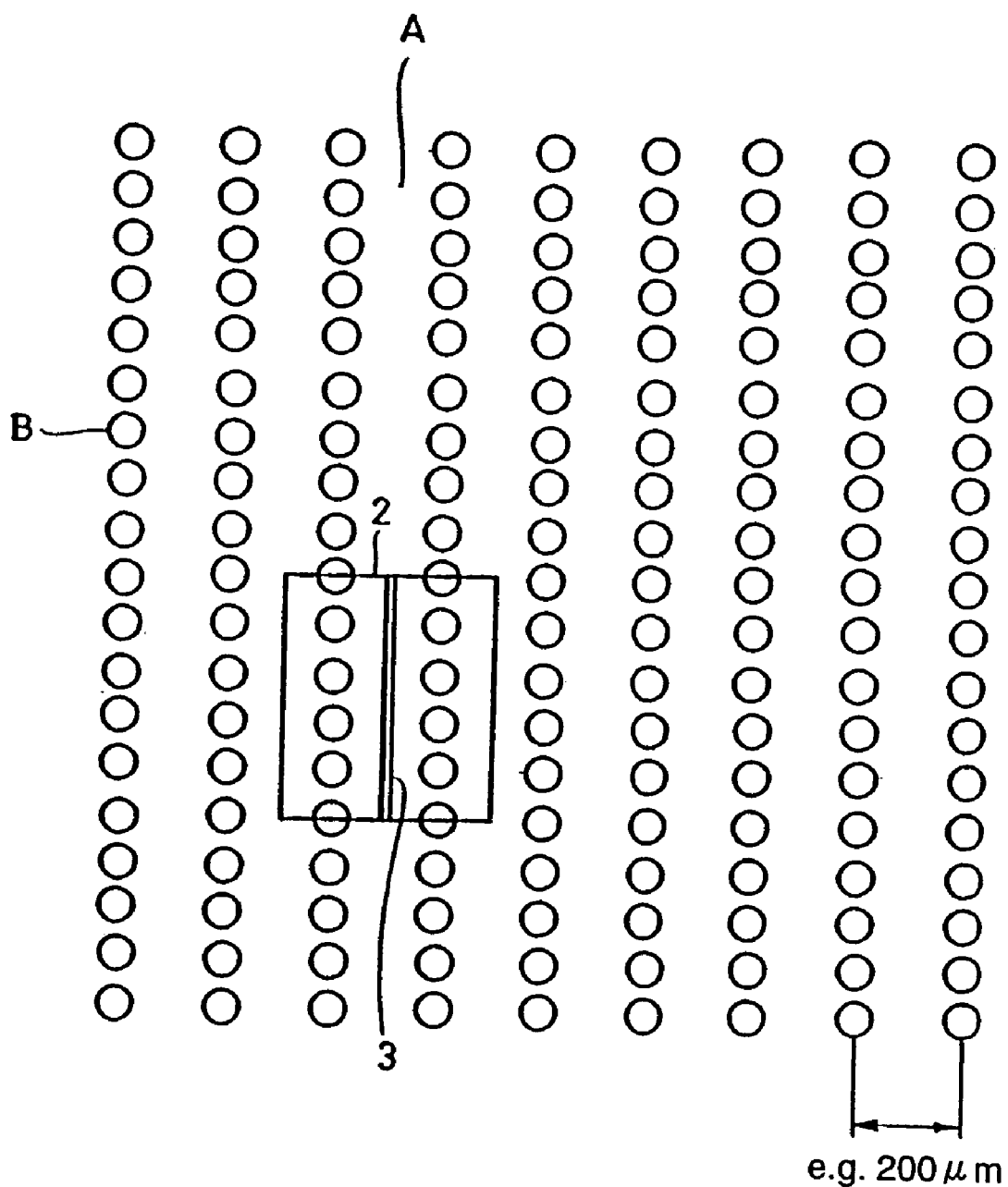
FIG. 29 is a plan view for explaining a method of manufacturing a GaN compound semiconductor laser according to the fifteenth embodiment of the invention.

FIG. 29 is a plan view showing a GaN substrate 1 used in the fifteenth embodiment.

In the fifteenth embodiment, as shown in FIG. 29, each laser stripe 3 extends near the center of the area between neighboring rows of regions B, and a pair of end surfaces parallel to the laser stripe 3 extends near the center of the area between the former rows of regions B and rows of regions B outwardly next to them.

The other features of the fifteenth embodiment are identical to those of the tenth and first embodiments. Therefore, their explanation is omitted.

The fifteenth embodiment also ensures the same advantages as those of the first embodiment.

Next explained is the sixteenth embodiment of the invention.

Figure 30:
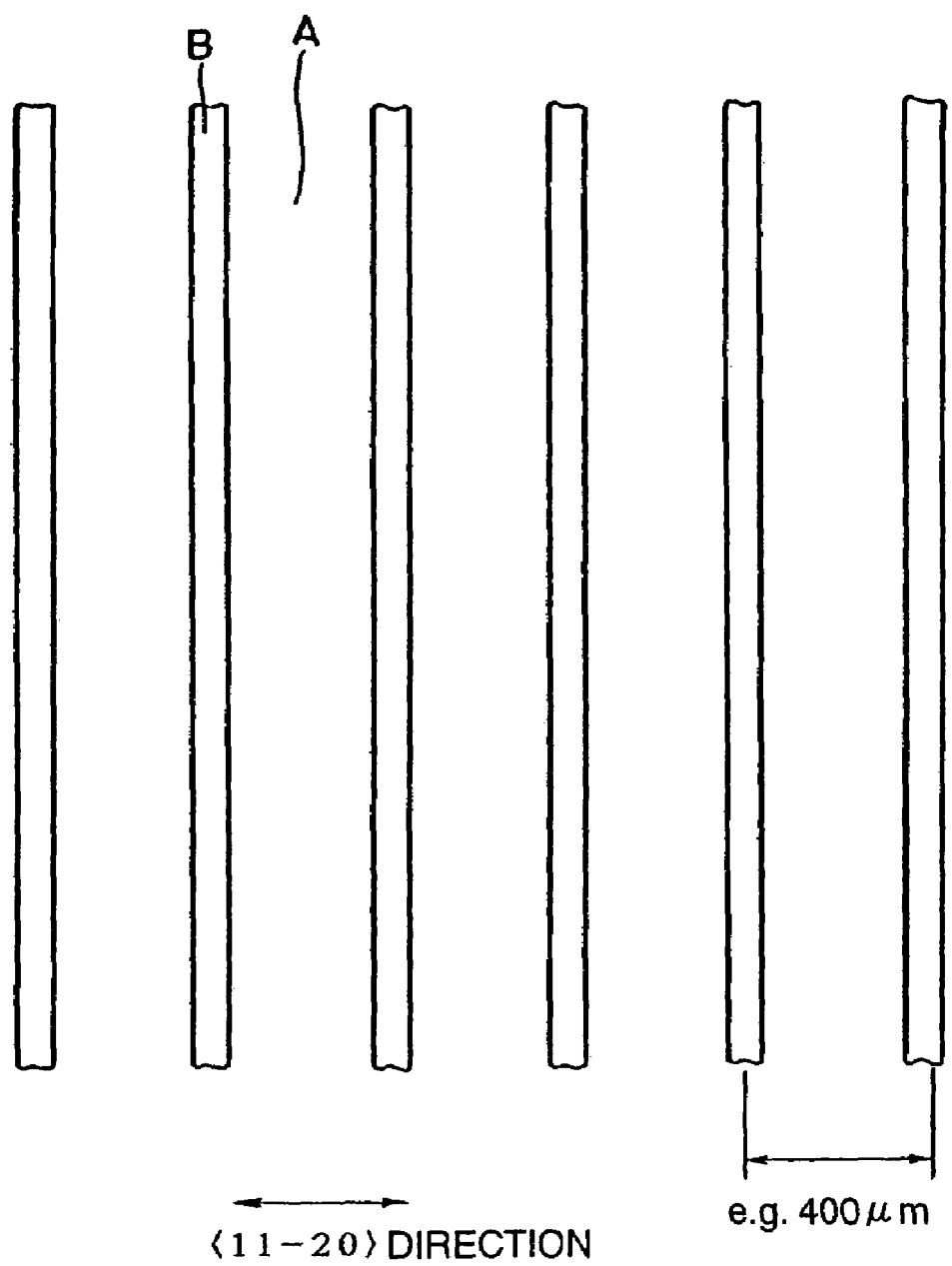
FIG. 30 is a plan view for explaining a method of manufacturing a GaN compound semiconductor laser according to the sixteenth embodiment of the invention.

FIG. 30 is a plan view showing a GaN substrate 1 used in the sixteenth embodiment. This GaN substrate 1 is an n-type substrate and having the C-plane orientation. The GaN substrate 1, however, may be of an R-plane, A-plane or M-plane orientation. In the GaN substrate 1, regions B composed of a crystal having a high average dislocation density and linearly extending in the <1-100> direction are periodically align in intervals of 400 μm, for example, in the <11-20> direction normal to the <1-100> direction. The <11-20> and <1-100> directions, however, may be vice versa.

Figure 31:
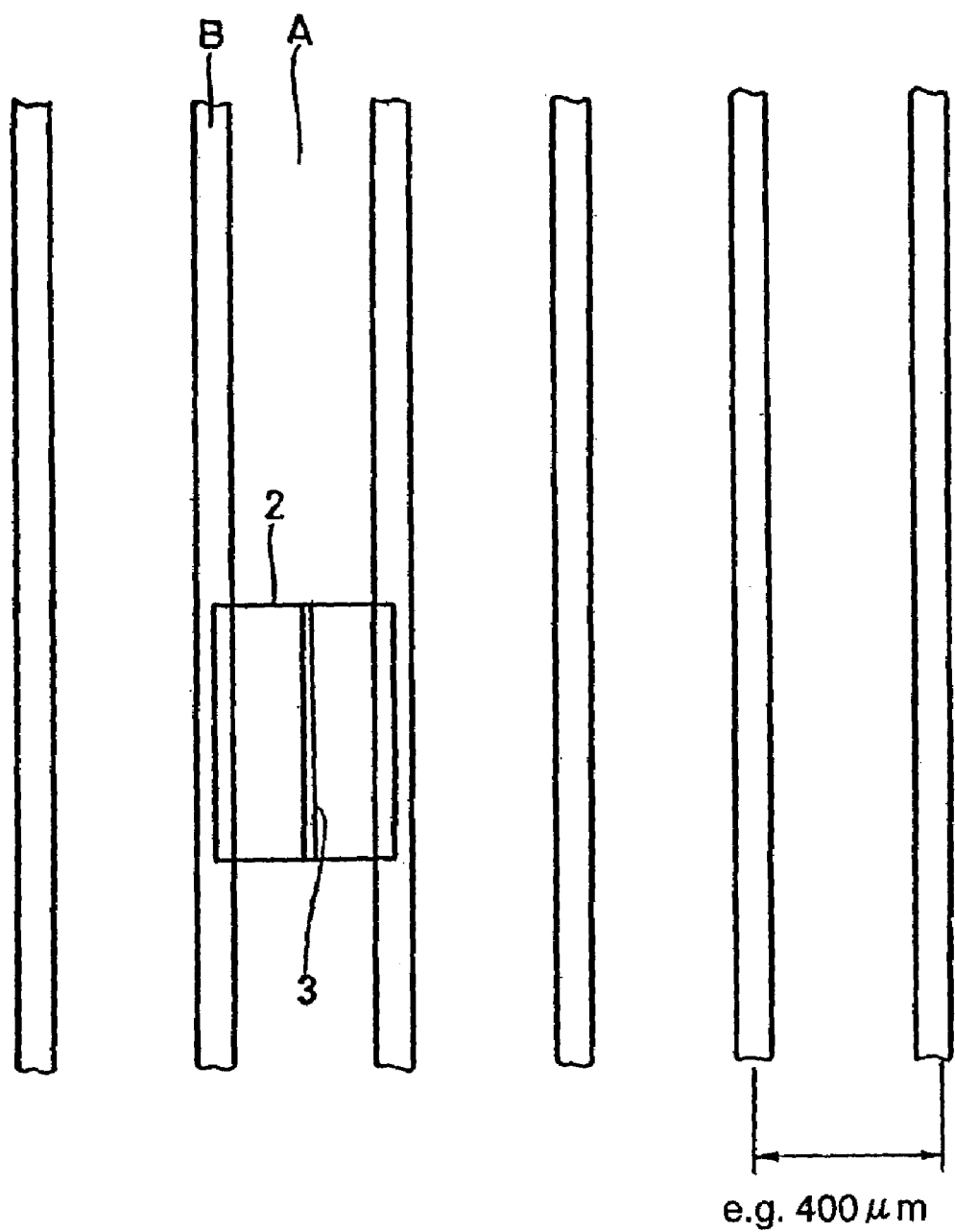
FIG. 31 is a plan view for explaining a method of manufacturing a GaN compound semiconductor laser according to the sixteenth embodiment of the invention.

In the sixteenth embodiment, as shown in FIG. 31, device regions 2 are defined such that a pair of end surfaces parallel to each laser stripe 3 lie on regions B and the laser stripe 3 resides near the center of the area between these regions B. In this case, any of the device regions 2 includes substantially no region B.

The other features of the sixteenth embodiment are identical to those of the first embodiment. Therefore, their explanation is omitted.

The sixteenth embodiment also ensures the same advantages as those of the first embodiment.

Next explained is the seventeenth embodiment of the invention.

Figure 32:
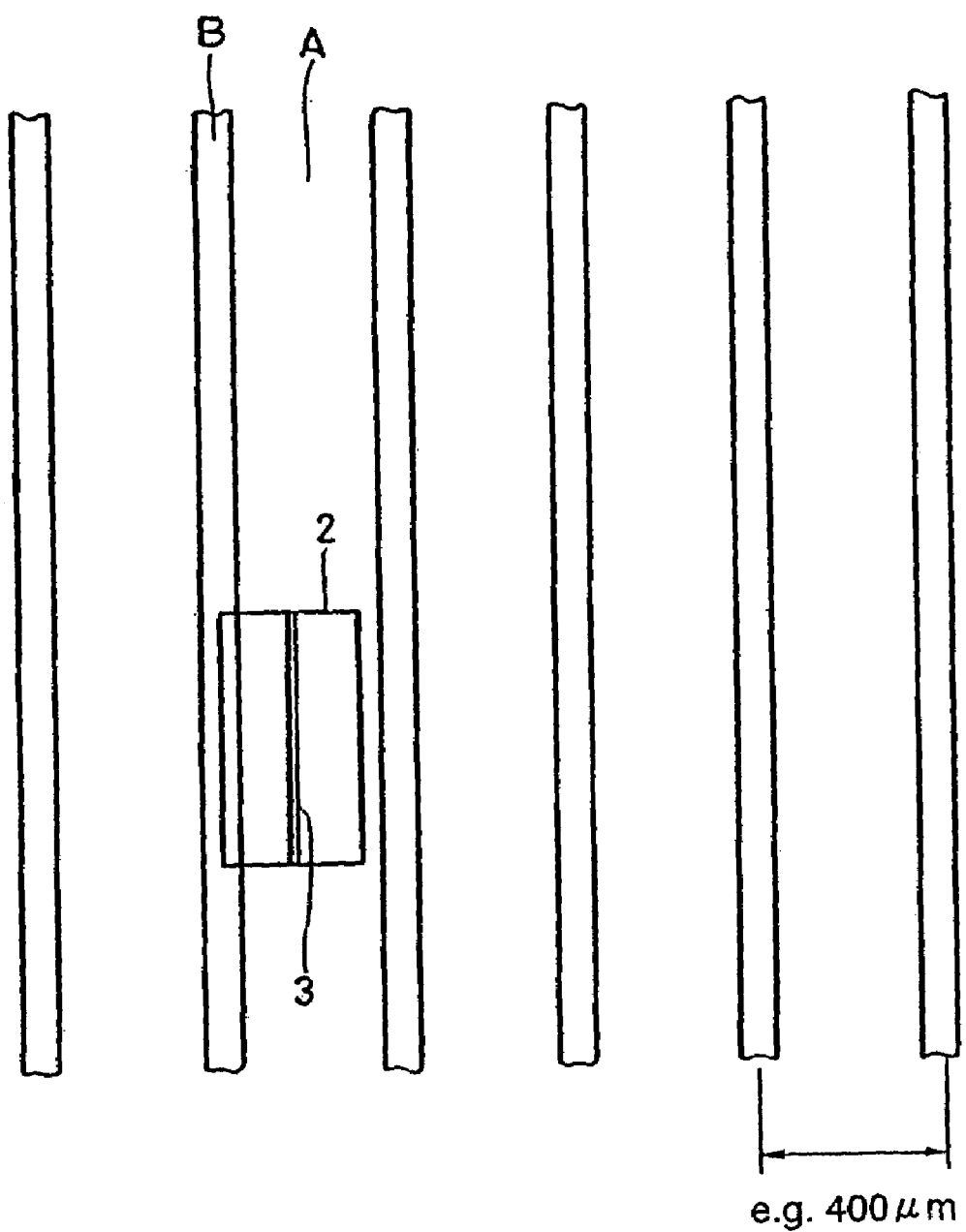
FIG. 32 is a plan view for explaining a method of manufacturing a GaN compound semiconductor laser according to the seventeenth embodiment of the invention.

As shown in FIG. 32, the seventeenth embodiment uses a GaN substrate 1 similar to that of the sixteenth embodiment. However, it is different from the sixteenth embodiment in that one of end surfaces parallel to each laser stripe 3 lies on one of regions B whereas the other end surface extends along a line distant from any of the linear regions B. Here again, any of the device regions 2 includes substantially no linear region B.

The other features of the seventeenth embodiment are identical to those of the sixteenth and first embodiments. Therefore, their explanation is omitted.

The seventeenth embodiment also ensures the same advantages as those of the first embodiment.

Next explained is the eighteenth embodiment of the invention.

Figure 33:
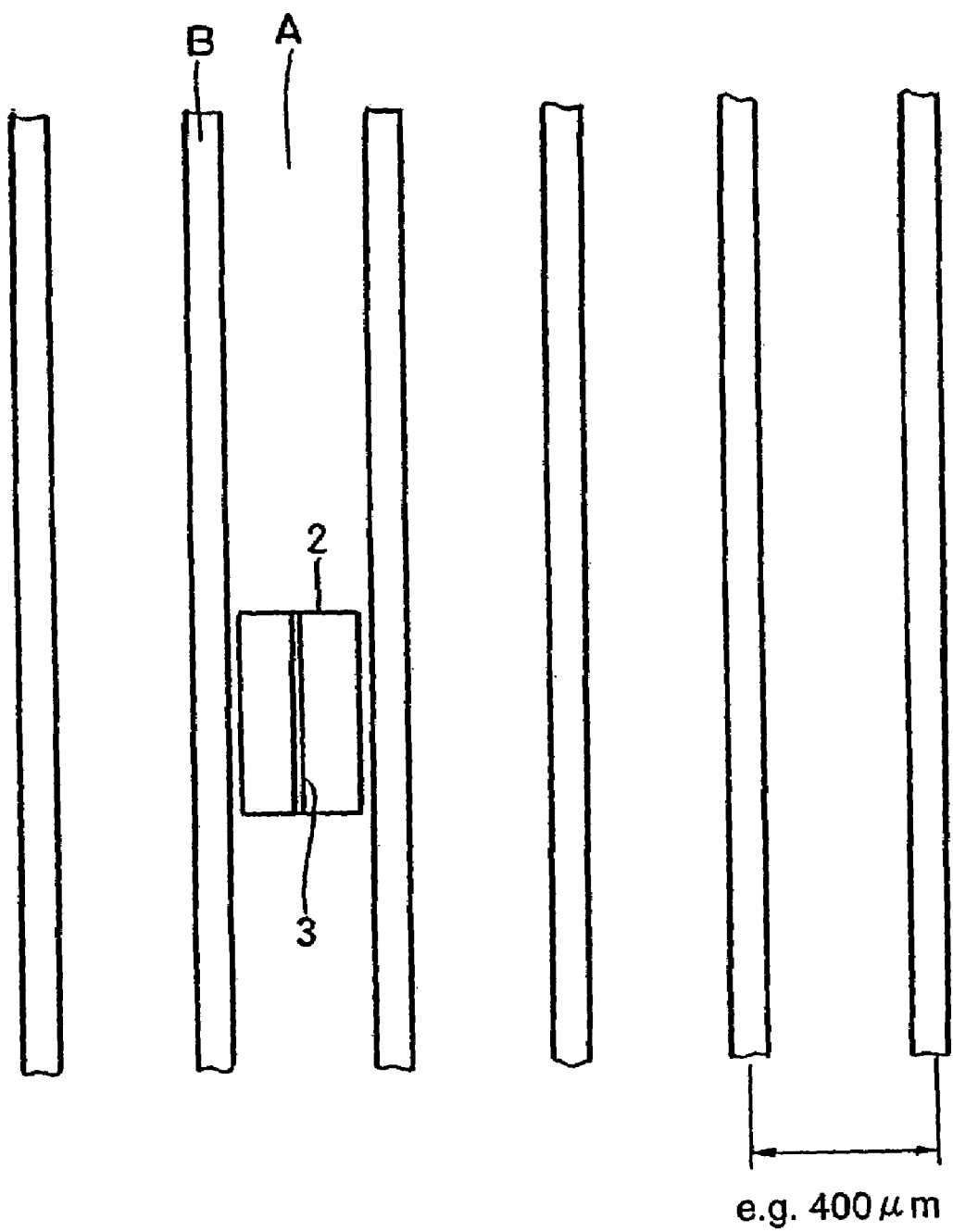
FIG. 33 is a plan view for explaining a method of manufacturing a GaN compound semiconductor laser according to the eighteenth embodiment of the invention.
Figure 34:
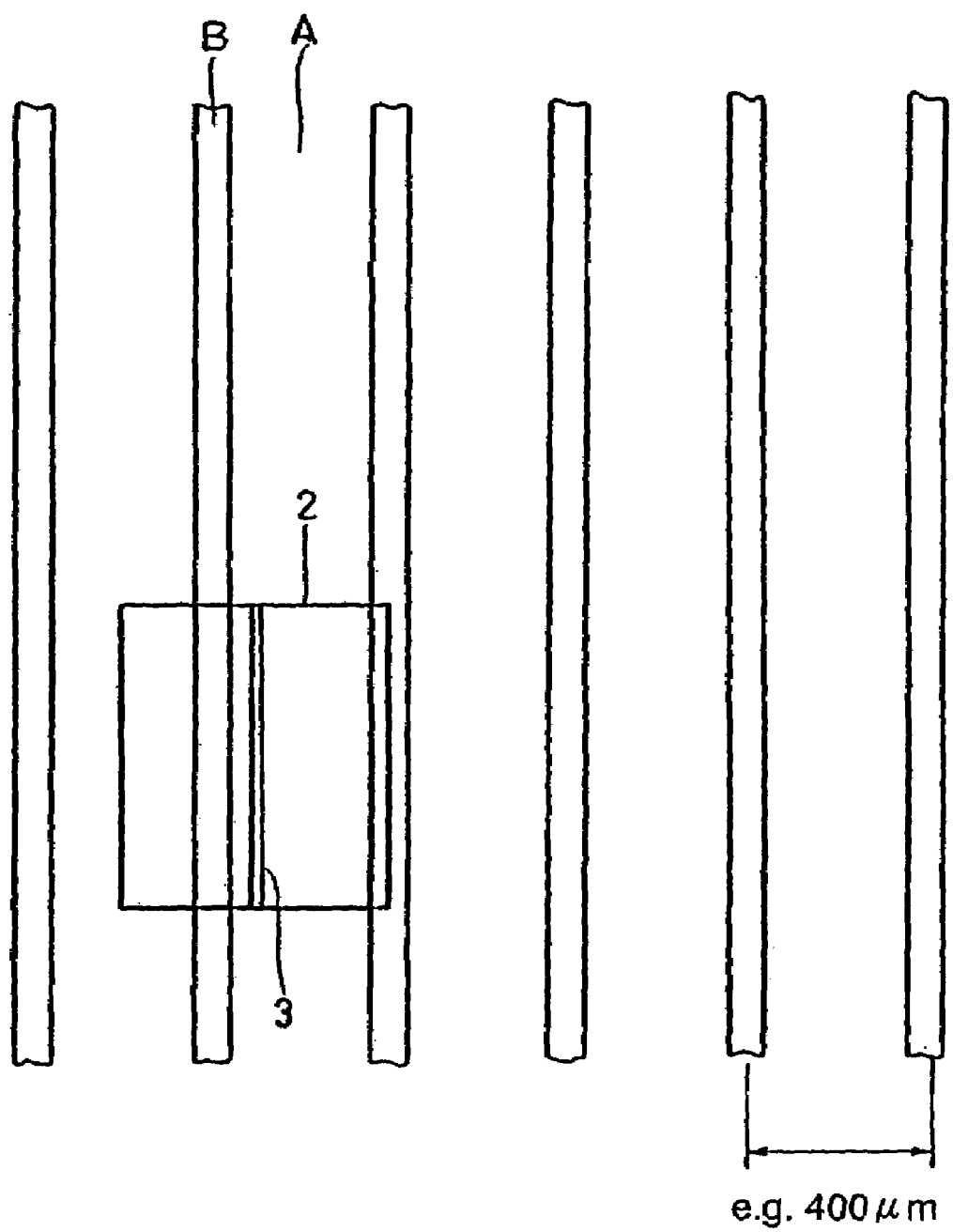
FIG. 34 is a plan view for explaining a method of manufacturing a GaN compound semiconductor laser according to the nineteenth embodiment of the invention.

As shown in FIG. 33, the eighteenth embodiment uses a GaN substrate 1 similar to that of the sixteenth embodiment. However, it is different from the sixteenth embodiment in that the device regions 2 are defined such that both of the opposite end surfaces parallel to each laser stripe 3 extend in the area between neighboring regions B and the laser stripe 3 extends near the center of the area between those regions B. Here again, any of the device regions 2 includes substantially no linear region B.

The other features of the eighteenth embodiment are identical to those of the sixteenth and first embodiments. Therefore, their explanation is omitted.

The eighteenth embodiment also ensures the same advantages as those of the first embodiment.

Next explained is the nineteenth embodiment of the invention.

As shown in FIG. 33, the eighteenth embodiment uses a GaN substrate 1 similar to that of the sixteenth embodiment. However, it is different from the sixteenth embodiment in that one of end surfaces parallel to each laser stripe 3 lies on one of regions B whereas the opposite end surface extend in the area between next two regions B and that the laser stripe 3 extends along a line distant from nearest one of regions B by at least 50 μm. In this case, each: device region 2 includes one region B.

The other features of the nineteenth embodiment are identical to those of the sixteenth and first embodiments. Therefore, their explanation is omitted.

The nineteenth embodiment also ensures the same advantages as those of the first embodiment.

Next explained is the twentieth embodiment of the invention.

Figure 35:
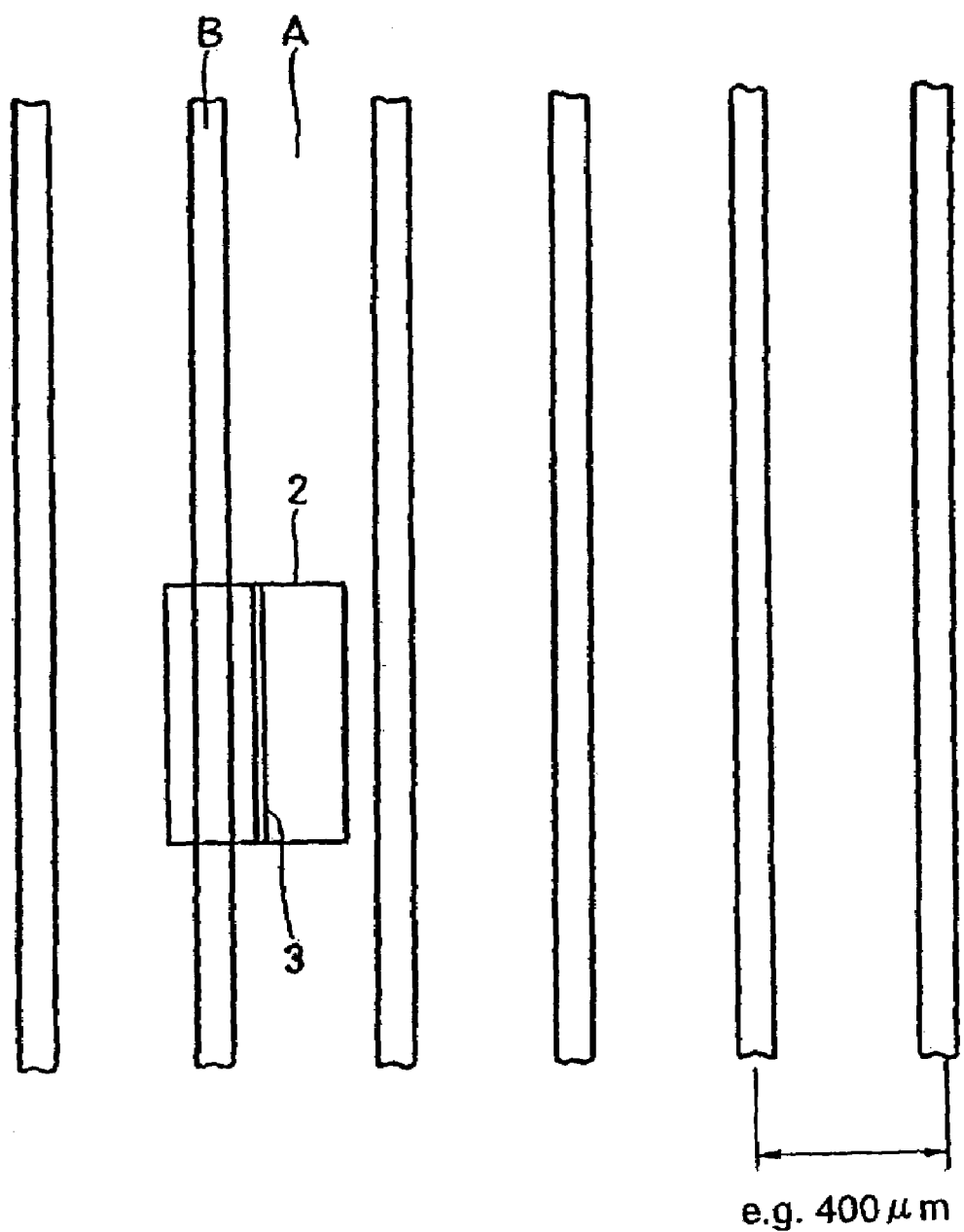
FIG. 35 is a plan view for explaining a method of manufacturing a GaN compound semiconductor laser according to the twentieth embodiment of the invention.

As shown in FIG. 35, the twentieth embodiment uses a GaN substrate 1 similar to that of the sixteenth embodiment. However, it is different from the sixteenth embodiment in that one of end surfaces parallel to each laser stripe 3 extends along a line distant from nearest one of regions B whereas the opposite end surface extend in the area between next two regions B and that the laser stripe 3 extends along a line distant from nearest one of regions B by at least 50 μm. In this case, each device region 2 includes one region B.

The other features of the twentieth embodiment are identical to those of the sixteenth and first embodiments. Therefore, their explanation is omitted.

The twentieth embodiment also ensures the same advantages as those of the first embodiment.

Next explained is the twenty-first embodiment of the invention.

Figure 36:
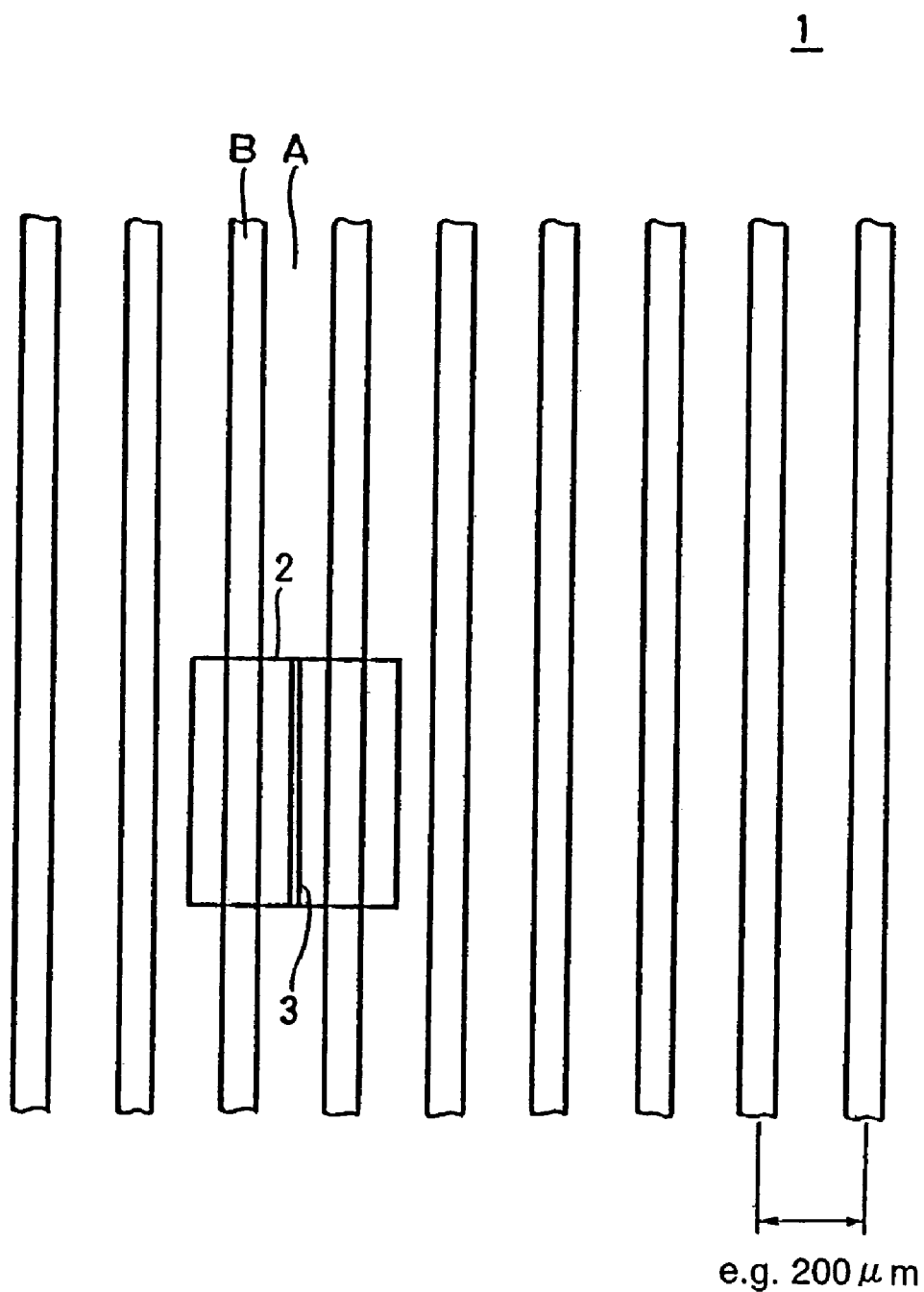
FIG. 36 is a plan view for explaining a method of manufacturing a GaN compound semiconductor laser according to the twenty-first embodiment of the invention.

FIG. 36 is a plan view of a GaN substrate 1 used in the twenty-first embodiment. The GaN substrate 1 is identical to the GaN substrate used in the sixteenth embodiment except that the regions B periodically align in the <11-20> direction of GaN in intervals of 200 μm, for example. In this case, each device region 2 includes two linear regions B.

In the twenty-first embodiment, as shown in FIG. 36, each laser stripe 3 resides near the center of the area between neighboring regions B, and a pair of end surfaces parallel to the laser stripe 3 extend in areas between those regions B and their outwardly neighboring regions B, respectively.

The other features of the twenty-first embodiment are identical to those of the sixteenth and first embodiments. Therefore, their explanation is omitted.

The twenty-first embodiment also ensures the same advantages as those of the first embodiment.

Heretofore, exemplary embodiments have been explained specifically. However, the present invention is not limited to those embodiments, but rather contemplates various changes and modification based on the technical concept of the invention.

For example, numerical values, structures, substrates, source materials, processes, and the like, which have been mentioned in conjunction with the above-explained embodiments, are not but mere examples, and any other appropriate numerical values, structures, substrates, source materials, processes, and the like, may be selected where necessary.

For example, those embodiments have been explained as first depositing n-type layers as components of laser structures on the substrate and thereafter depositing p-type layers. However, the order of depositing layers may be inverted to deposit p-type layers first on the substrate and deposit n-type layers thereon.

Further, those embodiments have been explained as being applied to the manufacture of GaN compound semiconductor lasers of SCH structures. However, the present invention is of course applicable to GaN compound semiconductor lasers of DH structures (double heterostructures), for example, and applicable to the manufacture of GaN compound light emitting diodes. Furthermore, the invention is applicable to electron transport devices using nitride III–V compound semiconductors, such as GaN compound FETs and GaN heterojunction bipolar transistors (HBTs).

The foregoing embodiments use $H_2$ gas as the carrier gas for growth by MOCVD. However, any other appropriate carrier gas, such as a mixed gas of $H_2$ with $N_2$ or with He, Ar gas, or the like.

Although the foregoing embodiments have been explained as forming cavity edges by cleavage, cavity edges may be formed by dry etching such as RIE.

As described above, according to the invention, device regions are defined on the nitride III–V compound semiconductor substrate, other semiconductor substrate or any kind of substrate such that active regions of devices do not substantially include the second regions higher in average dislocation density, higher in average defect density or inferior in crystalline property to the first region. Therefore, even if dislocations or other defects propagate from the second regions to nitride III–V compound semiconductor layers, other semiconductor layers, or layers of any other various kinds of materials, which are deposited for forming light emitting device structures or other device structures, it is ensured that chips obtained by dicing the substrate include substantially no dislocations or other defects. As a result, the invention can realize semiconductor light emitting devices excellent in emission property, enhanced in reliability and elongated in lifetime, or other semiconductor devices excellent in property, enhanced in reliability and elongated in lifetime, or other various kinds of devices excellent in property, enhanced in reliability and elongated in lifetime.

The invention claimed is:

1. A method of manufacturing a semiconductor light emitting device by growing nitride III–V compound semiconductor layers forming a light emitting device structure on a nitride III–V compound semiconductor substrate in which a plurality of second regions have a second average dislocation density higher than a first average dislocation density, wherein the plurality of second regions align regularly in a first region made of a crystal, the first region having the first average dislocation density, comprising:

defining a device region on the nitride III–V compound semiconductor substrate such that the device region does not include the second regions substantially, wherein at least one of the second regions has a c-axis that is inverted relative to the first region.

2. A method of manufacturing a device by growing layers to form a device structure on a substrate in which a plurality of second regions have a second average dislocation density higher than a first average dislocation density and extend linearly, the plurality of second regions align regularly in parallel to each other in a first region made of a crystal, the first region having the first average dislocation density, comprising:

defining a device region such that the interval of the second regions is 50 μm or more, one or more of the second regions are included, and an active region of the device does not include the second regions, wherein at least one of the second regions has a c-axis that is inverted relative to the first region.

3. The method of manufacturing a device according to claim 2 wherein the substrate is a nitride III–V compound semiconductor substrate and the device is a semiconductor light emitting device.

4. The method according to claim 1 wherein the second regions are stripe-shaped regions.

5. The method according to claim 1 wherein the second regions align periodically to form rectangular lattices.

6. The method according to claim 1 wherein the second regions align periodically to form hexagonal lattices.

7. The method according to claim 1 wherein the device is a light emitting diode.

8. The method according to claim 1 wherein the device is a laser diode.

9. The method according to claim 2 wherein the second regions are stripe-shaped regions.

10. The method according to claim 2 wherein the second regions align periodically to form rectangular lattices.

11. The method according to claim 2 wherein the second regions align periodically to form hexagonal lattices.

12. The method according to claim 2 wherein the device is a laser diode.

* * * * *